(12) United States Patent
He

(10) Patent No.: US 8,643,444 B2
(45) Date of Patent: Feb. 4, 2014

(54) COMMON REFERENCE CRYSTAL SYSTEMS

(75) Inventor: Rong He, San Diego, CA (US)

(73) Assignee: Broadcom Corporation, Irvine, CA (US)

(*) Notice: Subject to any disclaimer, the term of this patent is extended or adjusted under 35 U.S.C. 154(b) by 35 days.

(21) Appl. No.: 13/487,700

(22) Filed: Jun. 4, 2012

(65) Prior Publication Data

US 2013/0321048 A1 Dec. 5, 2013

(51) Int. Cl.
*H03B 5/32* (2006.01)
*H04B 1/06* (2006.01)

(52) U.S. Cl.
USPC .................................... 331/158; 331/176

(58) Field of Classification Search
USPC .................................... 331/158, 176, 66
See application file for complete search history.

(56) References Cited

U.S. PATENT DOCUMENTS

| | | | | |
|---|---|---|---|---|
| 7,239,857 | B2 * | 7/2007 | Abraham | 455/255 |
| 7,764,133 | B1 * | 7/2010 | Nicholls | 331/69 |
| 7,928,811 | B2 * | 4/2011 | Brodie | 331/158 |
| 2002/0167441 | A1 | 11/2002 | McBurney et al. | |

FOREIGN PATENT DOCUMENTS

EP    2101188    9/2009

OTHER PUBLICATIONS

European Search Report for application 13002578.6-1811 mailed Sep. 19, 2013.

* cited by examiner

*Primary Examiner* — Joseph Chang
(74) *Attorney, Agent, or Firm* — Thomas | Horstemeyer, LLP

(57) ABSTRACT

One embodiment of communication system comprises a crystal oscillator configured to output a reference clock; cellular radio frequency (RF) and baseband phase locked loops configured to receive the reference clock within a cellular module and compensate for calculated frequency errors between a received cellular downlink signal and a cellular local oscillator signal during operation of the cellular module; global positioning system (GPS) frequency compensation circuitry configured to receive the reference clock within a GPS module and compensate for calculated frequency errors during operation of the GPS module; and a temperature sensing circuit which includes a plurality of sensing resistors and is configured to output a signal corresponding to a temperature of a reference crystal which is translated to a frequency deviation, wherein the (GPS) frequency compensation circuitry is configured to offset the frequency deviation and output a temperate compensated signal to meet GPS clock frequency requirements.

20 Claims, 15 Drawing Sheets

COMMON REFERENCE CRYSTAL SYSTEMS

TECHNICAL FIELD

The present disclosure is generally related to reference crystal oscillators for co-integrated communication systems and standalone systems.

BACKGROUND

In recent years, cellular communication solutions have transitioned to lower cost uncompensated quartz piezoelectric crystal solutions. However, these low-cost (crystal) cellular solutions cannot inherently be transitioned to a low-cost (uncompensated) crystal solution common to and shared by cellular and Global Positioning System (GPS) systems within a single mobile platform due to the GPS system's stringent maximum frequency slew rate and maximum frequency step change requirements. In prior art embodiments, the GPS system's stringent maximum frequency slew rate and maximum frequency step change requirements generally necessitate incorporation of a Temperature-Compensated-Crystal-Oscillator (also known as a TCXO) to serve as the GPS system's reference oscillator. This TCXO requirement generally applies to both standalone GPS systems and to co-integrated GPS and cellular systems.

BRIEF DESCRIPTION OF THE DRAWINGS

Many aspects of the present disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views.

DETAILED DESCRIPTION

Figure 1:
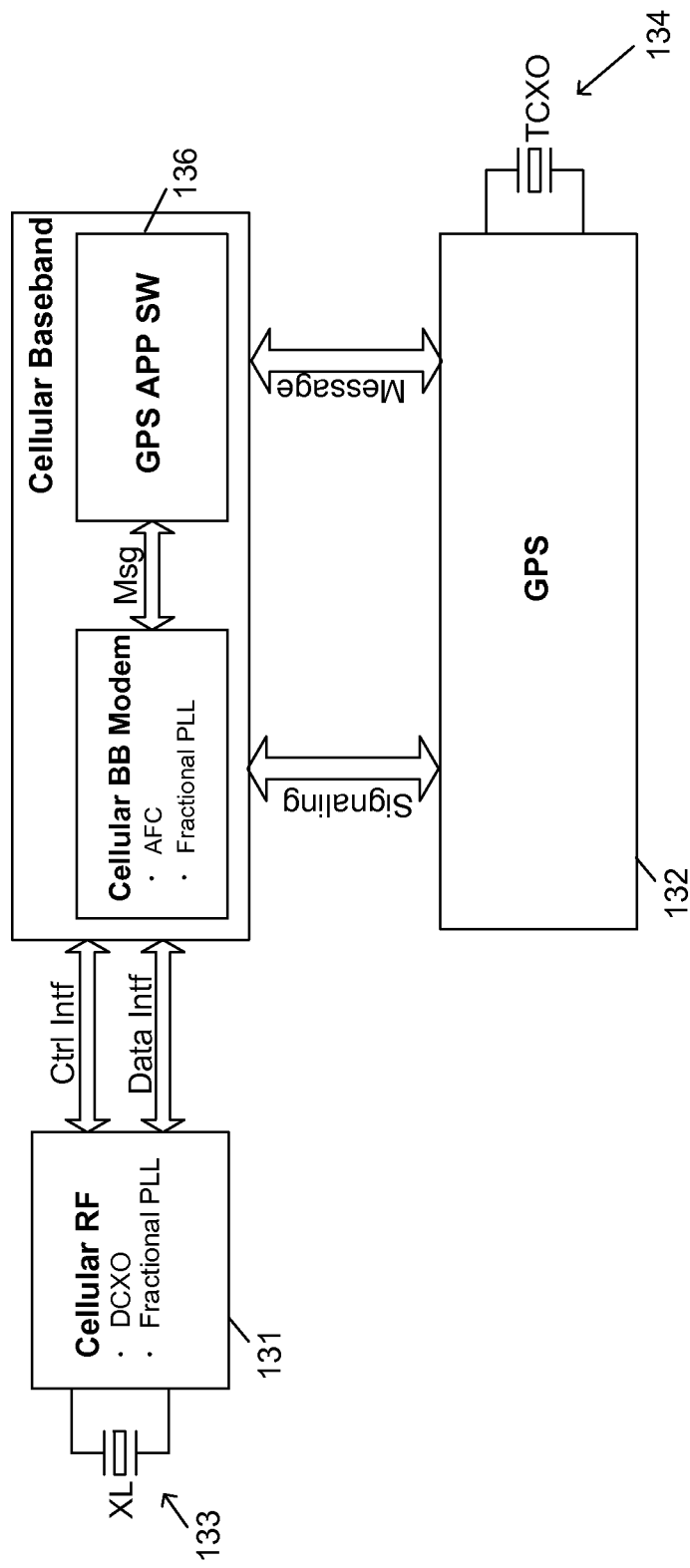
FIG. 1 is a system diagram illustrating a high-level architecture for an exemplary system in which co-integrated cellular and GPS systems employ separate crystals for their respective crystal resonator-based reference oscillators.

Disclosed herein are certain embodiments incorporating a reference crystal oscillator system. In some embodiments, a single crystal oscillator is employed throughout a system, where the single crystal resonator 102 (FIG. 2) is dedicated for use with a standalone GPS systems or other standalone frequency sensitive systems. In other embodiments, the single crystal resonator 102 (FIG. 2) is shared as may be the case with a cellular system 101 and a GPS system 108 that are co-integrated.

In an exemplary embodiment, a single crystal resonator 102 is not in itself compensated (e.g. it is not a TCXO, a Voltage Controlled Temperature Compensated Crystal Oscillator-VCTCXO, nor a Digital Controlled Crystal Oscillator (DCXO)) type crystal oscillator. For instance, in one embodiment, the crystal resonator 102 comprises an uncompensated crystal resonator and external temperature sensor (e.g., thermistor) 105 or co-integrated (thermistor-based) thermal sensing uncompensated crystal oscillator (TSX). Further, temperature sensing and compensation circuits or modules 120, 122—which may be external to the GPS system or module 108 or integrated with the GPS system 108 (e.g., as part of an integrated semiconductor chip or circuit)—compensate for calculated frequency errors due to crystal temperature drift in the GPS system 108, in some embodiments.

In various embodiments, the crystal resonator 102 is allowed to run free (i.e. no correction signals are applied thereto) for the cellular system 101 (e.g., cellular baseband system or C-BB 106, cellular RF system or C-RF 104, etc.). For cellular purposes, the C-BB 106 calculates frequency errors between a received downlink cellular signal and the cellular RF system's local oscillator (LO) frequency, as well as timing errors derived from the frequency error. These errors are then compensated in the cellular Rx PLL (receiver phase locked loop) 112 and the C-BB's DPLL (digital PLL) 110, respectively. This allows the C-BB's crystal oscillator circuit (crystal resonator 102 & crystal oscillator (XO) 103) to run unperturbed, which is used for C-RF system 104 and is also buffered and shared with the GPS solution or system 108. In parallel, the GPS solution 108 utilizes a temperature sensor (e.g., thermistor) 105 that is thermally proximal to the crystal resonator 102 and incorporates a temperature sensing circuit 122, as well as temperature-to-frequency compensation software 120 to compensate any frequency error caused by temperature drift in GPS Rx PLL 114 or GPS BB numerically controlled oscillator (NCO) 115 or in both such that temperature compensated GPS system clock can meet aforementioned stringent requirements.

An embodiment of the temperature-to-frequency compensation software 120 encompasses both a temperature conversion software module 123 and a temperature-to-frequency conversion module 124. The temperature conversion software module 123 can perform voltage-to-temperature conversions, current-to-temperature conversions, or resistor-to-temperature conversions in various embodiments. Accordingly, in one embodiment, the temperature conversion software module 123 translates the temperature sensing circuit's output voltage (or current in current-mode implementations) to a specific temperature.

This voltage/current/resistance to temperature translation takes into account the thermistor's resistance versus temperature characteristic, where the temperature sensing circuit's transfer function includes supply voltage, gains, voltage (current or resistance) offsets, voltage divider ratios, etc., as discussed subsequently. In addition, an embodiment of the temperature-to-frequency conversion software module 124 translates temperature estimates provided by module 123 to frequency deviation estimates, where the frequency deviations are the result of the quartz crystal resonator-based reference oscillator's frequency versus temperature characteristic which is conventionally modeled by a third-order polynomial—the details of which are also discussed subsequently. In some embodiments, modules 123 and 124 can be combined as one module.

Conversely, in the exemplary system architecture of FIG. 1, the cellular reference oscillator circuit 131 & 133 is generally independent and separate from the GPS system's reference oscillator circuit 134. In particular, FIG. 1 illustrates a high-level architecture for an exemplary system in which co-integrated cellular and GPS systems employ separate crystals for their respective crystal resonator-based reference oscillators. In this figure, the cellular system's crystal 133 is a low cost crystal coupled with an integrated DCXO and the GPS system's crystal 134 is a TCXO.

Furthermore, the GPS system's TCXO 134 is generally tailored to meet the aforementioned GPS system's stringent maximum frequency slew rate and maximum frequency step change requirements. For a TCXO tailored for a GPS system, three of the GPS-tailored TCXO-based reference oscillator's key performance specifications are:

Continuous frequency output;
Maximum absolute frequency deviation; and
Maximum frequency drift per degree Centigrade.

For exemplary purposes, the values for the last two performance specifications are stipulated as 2 ppm and 20 ppb/° C., respectively. These stipulated values are in general agreement with values described by the system diagram of FIG. 1 but are not intended to limit the applicability of the present disclosure to products in which the corresponding actual specifications are identical to nor approximately identical to the exemplary values stipulated above.

In addition, all physical systems—be they standalone GPS, co-integrated GPS and cellular communications systems, etc.—have a maximum specified internal heat dissipation, which combined with the mobile communications system's ambient environment temperature will cause the temperature of components within the system to change as a function of time. Of particular interest in the present disclosure is the maximum and minimum rate of temperature change of the quartz crystal resonator components. For exemplary purposes, this maximum/minimum crystal resonator temperature change rate is stipulated as ±½° C./sec. Thus, under these exemplary stipulated conditions, the rate at which the GPS system's crystal resonator-based reference oscillator's output frequency changes does not exceed 10 ppb/sec.

Consequently, the applicable circuitry and algorithms 136 incorporated into GPS systems employing TCXO reference oscillators 134 based on the aforementioned stipulated exemplary performance specifications are capable of meeting their GPS system performance requirements provided their crystal resonator-based reference oscillator's output frequency differs from its ideal target (frequency) value by no more than 2 ppm and the rate at which the reference oscillator output frequency changes versus temperature does not exceed 20 ppb/° C. Equivalently, by also incorporating the aforementioned exemplary stipulated crystal resonator maximum/minimum time rate of temperature change (±½° C./sec), the circuitry and algorithms 136 incorporated into GPS systems employing TCXO reference oscillators 134 based on the aforementioned stipulated exemplary performance specifications are also capable of meeting their GPS system performance requirements provided their crystal resonator-based reference oscillator's output frequency differs from its ideal target (frequency) value by no more than 2 ppm and the rate at which the reference oscillator output frequency changes versus time does not exceed 10 ppb/sec.

Hereafter, in the present disclosure, when the GPS system reference oscillator's maximum absolute output frequency deviation or the GPS system reference oscillator's maximum output frequency drift rate are indicated, these stipulated exemplary values (2 ppm and 10 ppb/sec) may be used without limiting the scope of the present disclosure to apply to only systems in which 2 ppm and 10 ppb/sec are indeed the system's specified maximum values. Also, any disclosed algorithms (e.g., algorithms 136) may be embodied as and cover software, firmware, and/or hardware in accordance with the present disclosure.

Thus, by similarity, provided the present disclosure's aforementioned composite temperature sensing circuit 122 and temperature-to-frequency compensation software 120 correctly estimate (relative to an ideal fixed and continuous target frequency reference), the uncompensated crystal resonator-based reference oscillator's frequency output (that is sampled at a sufficient rate and with sufficient accuracy such that the total error between the true frequency deviation during the sample interval and the estimated frequency deviation during the sample interval) does not exceed the previously stipulated exemplary 3 ppb maximum. In other words, the sample-to-sample error between the true and estimated frequency deviation, when applied as a compensation signal, is equivalent to a discontinuity in the compensated frequency output as are compensation signals when the sample rate is insufficient for the frequency output's time rate of change.

Additionally, the uncompensated crystal resonator-based reference oscillator's maximum absolute frequency deviation between the temperature-to-frequency compensated GPS reference frequency and the aforementioned ideal fixed & continuous target frequency does not exceed 2 ppm. Further, the maximum apparent frequency drift per second between the temperature-to-frequency compensated GPS reference frequency and the aforementioned ideal fixed & continuous target frequency reference does not exceed 10 ppb/sec.

Then, under these constraints, the circuitry and algorithms 136 incorporated into prior art GPS systems are also capable without substantial revision of meeting all the previously mentioned GPS system performance requirements, when in fact an uncompensated crystal resonator based reference oscillator is compensated (externally to the crystal component) by the aforementioned embodiments of the composite temperature sensing circuit 122 and temperature-to-frequency compensation software 120.

The remarks just presented are not intended to limit the applicability of the present disclosure to systems in which the GPS circuitry and algorithms may seem similar to that of prior art GPS systems, but instead are intended to illustrate the ease with which the components of the present disclosure can be integrated into GPS systems and thereby eliminate the need for TCXO-based GPS system reference oscillators 134. As stated above, various embodiments of the present disclosure may utilize an external thermistor or a thermistor 105 integrated with a crystal resonator 102. In addition, embodiments of the temperature sensing circuit 122 described as part of the disclosure herein may include a (switched) sense/bias resistor array, offset resistor ($R_{OS}$), feedback resistors, operational amplifier, and analog-to-digital converter (ADC) circuitry along with software or firmware logic to implement compensation algorithms. In another embodiment, where a crystal resonator (e.g., TSX) 102 is shared, an embodiment of the C-BB 106 calculates frequency errors between received cellular downlink signal and cellular LO frequency, as well as timing errors derived from the frequency error. The C-BB 106, then compensates these errors in the cellular RX PLL (receiver phase locked loop) 112 and the C-BB's DPLL (digital PLL) 110, respectively.

In parallel, an embodiment of the temperature sensing circuit 122 and temperature-to-frequency compensation software 120, which can be implemented in a cellular, a GPS, or a co-integrated cellular-GPS combo chip, compensates for any frequency error caused by temperature drift in a crystal oscillator 103 (e.g., DCXO) to which the crystal resonator (e.g., TSX) 102 is coupled. A buffered clock from the crystal oscillator 103 may then be used as a reference clock for the GPS system 108. In this embodiment of a shared crystal 102 between cellular and GPS systems, the crystal resonator 102 and its coupled crystal oscillator 103 are free of frequency changes from the cellular system 101; however, the reference frequency is compensated through a crystal oscillator 103 coupled with the crystal resonator 102 by an embodiment of the temperature sensing circuit 122 to estimate the crystal resonator's temperature drift.

Embodiments of the temperature sensing circuit 122 may estimate the temperature drift in a way that the crystal oscillator frequency output is continuous up to approximately 1-ppb resolution, the crystal oscillator frequency output's maximum absolute frequency deviation is less than the previously stipulated exemplary 2 ppm, and the crystal oscillator frequency output's maximum frequency drift is less than the previously stipulated exemplary 10 ppb/sec. In various embodiments described herein, the crystal resonator-based oscillator's part-to-part frequency variation at room temperature is assumed to be calibrated in factory and compensated during initial cellular and GPS power up phase.

Figure 2:
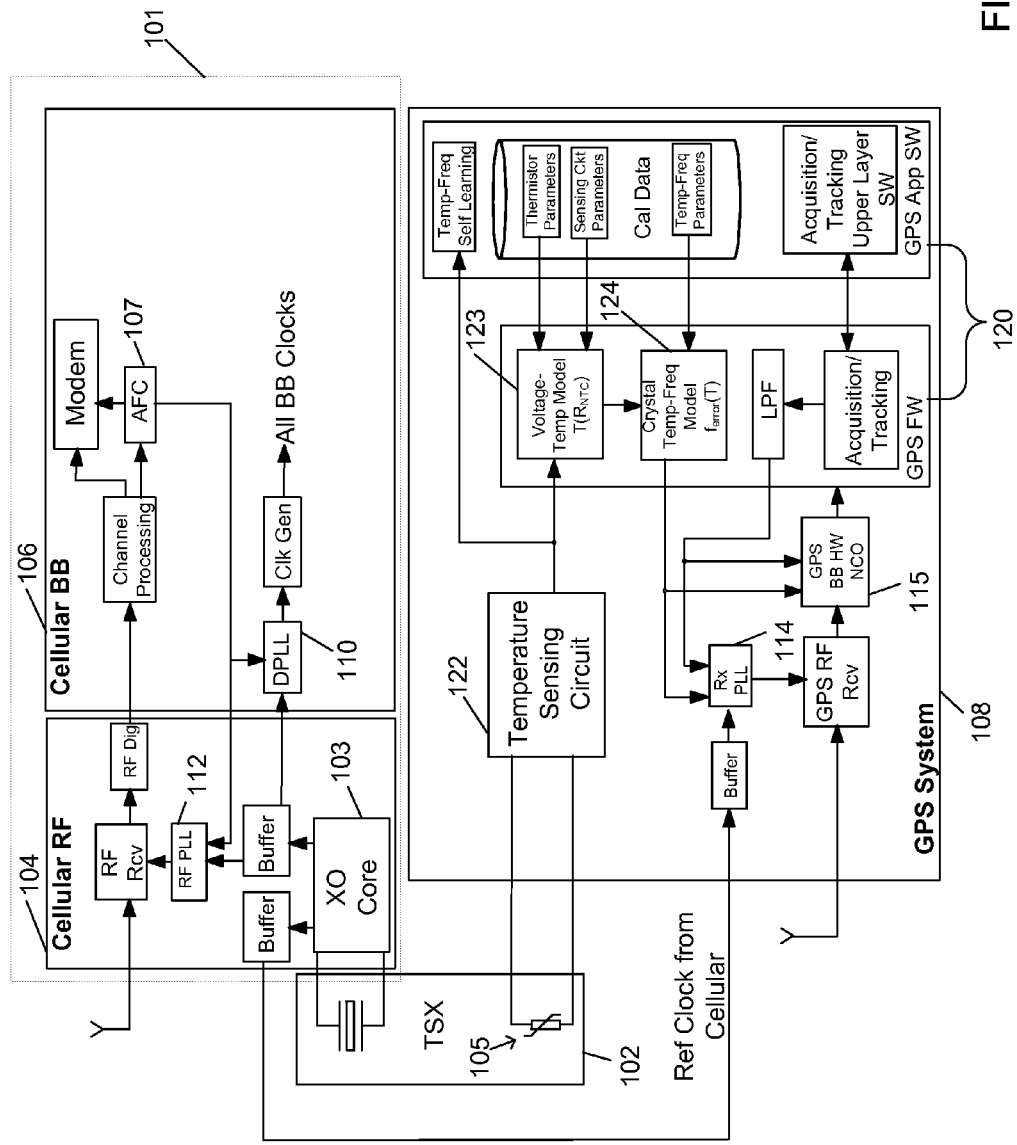
FIG. 2 is a system diagram illustrating a high level architecture for an embodiment of a co-integrated (or shared) reference crystal oscillator system between cellular and GPS systems in accordance with the present disclosure

FIG. 2 is a system diagram illustrating a high level architecture for an embodiment of a shared reference crystal oscillator system employed in co-integrated mobile communication systems, wherein the shared crystal resonator 102 is an exemplary TSX. The crystal resonator 102 is shared between a cellular system 101 and a GPS system 108. The GPS system 108 is operable to determine location information based on received global navigation satellite system (e.g., GPS, GLONASS, GALILEO, etc.) signals. The cellular system 101 includes a cellular RF (radio frequency) system 104 and cellular baseband system 106.

Although alternative embodiments of the cellular system 101 can operate from a single (uncompensated) crystal oscillator 103, some embodiments of the cellular baseband 106 can employ a digital fractional PLL 110 and corresponding RF analog circuitry 104 can employ a Phase-Locked-Loop (PLL) oscillator 112 with sufficient resolution to meet cellular requirements.

For the cellular system 101, the automatic frequency control function or module (AFC) 107 estimates the frequency error between a local oscillator signal and a received cellular downlink signal. The frequency error estimate is passed to the DPLL 110 and RF PLL 112 for timing and frequency compensation, respectively.

For the GPS system 108, to implement the free-running (quartz) crystal oscillator circuit 102 & 103, the temperature sensing circuit 122 periodically measures the temperature drift via the temperature sensing circuit 122, translates temperature drift into frequency error based on the crystal resonator's calibrated temperature-frequency characteristic curve estimation, and communicates the frequency error to GPS Rx PLL 114 or GPS BB NCO 115 (numerically controlled oscillator) or both in order to generate a temperature compensated LO frequency or temperature compensated BB signals.

In one embodiment, the local clock source in a cellular RF system 104 and local clock source in a cellular BB system 106 come from different PLLs 110, 112 that are compensated asynchronously, although frequency error estimates are derived from the received cellular downlink signals and cellular LO. Accordingly, some embodiments employ a rate adaptor or a Read/Write sync design at an RF-BB interface to avoid possible missing samples over a period of time. In other embodiments, local clock source in cellular RF 104 and BB 106 can come from the same source and thus can be compensated synchronously.

As represented in FIG. 2, embodiments of the present disclosure utilize a high-resolution, low noise temperature sensing circuit 122 for GPS temperature compensation which allows for elimination of the previously required GPS TCXO 134. In the figure, a temperature sensor 105 is represented as, but not limited to, being contained within (or integrated with) the crystal resonator 102. The temperature sensor or thermistor 105 may also be external to the crystal resonator 102 in some embodiments, including thermally proximal to the crystal resonator 102.

An embodiment of the high-resolution, low noise temperature sensing circuit 122 is utilized with the temperature sensor or thermistor hardware 105. In various embodiments, the temperature sensing circuit 122 can be external to the GPS module or system 108 or the integrated circuit upon which the GPS system is fabricated. Additionally, in some embodiments, the temperature sensing circuit 122 can be integrated with the GPS module or system 108 and/or cellular system 101 or the integrated circuit upon which the GPS system and/or cellular systems are fabricated. The temperature sensing circuit's resolution and noise requirements enable sufficiently small residual temperature uncertainty after temperature compensation to permit the GPS solution to compensate its RX PLL 114 and/or receiver channel digital clocks to maintain satellite lock over the shared C-BB free-running crystal's full operational temperature variation range.

Solutions incorporating embodiments of the present disclosure satisfy the GPS system's stringent maximum frequency step size and maximum frequency slew rate while sharing (with the cellular solution) a single crystal resonator 102. The crystal resonator 102 can be characterized as being low cost (e.g., ~15¢) uncompensated quartz crystal resonator component employed within the cellular reference oscillator (XO) 103 and temperature sensor 105 in some embodiments. Some embodiments may also be characterized as employing a co-integrated uncompensated quartz crystal resonator and temperature sensor (TSX) versus a VCTCXO or TCXO (e.g., ~75¢) typically required today to satisfy the GPS system's stringent maximum frequency slew requirement. While the GPS maximum frequency step size and slew rate depend on GPS design, an exemplary figure can be a 3 ppb maximum step size and a 10 ppb/sec maximum frequency slew rate.

Historically, GPS systems have required a temperature compensated crystal oscillator (TCXO) 134 with relatively tight tolerance on overall frequency variation (≤±0.5 ppm), but with extremely tight tolerance on maximum frequency slewing (≤±10 ppb/sec). The cost of the TCXO 134 is approximately a 60¢ premium above the cost of uncompensated quartz crystal resonators that currently satisfy cellular system requirements, when the cellular system 101 is not co-integrated with a GPS system 108 or when the cellular 101 and GPS systems 108 do not share a quartz crystal resonator-based reference oscillator.

Embodiments of the present disclosure, advantageously enable for the first time a co-integrated GPS and cellular solution to share a single quartz crystal resonator 102 that incorporates neither voltage control nor temperature compensation within the crystal resonator (exclusive of co-integrated temperature sensor 105 or thermistor hardware used for temperature compensation, in some embodiments) and thereby eliminates VCTCXO or TCXO parts from the solution's bill of materials.

Ultimately, an objective of the disclosed embodiments is to provide dynamic reference oscillator frequency estimates that are accurate to the parts-per-billion (ppb) level and captured at a sufficient rate to provide ppb level reference oscillator frequency slewing resolution as well. Under normal operation, the frequency estimates are made, by proxy, using temperature measurements. These temperature measurements leverage the unprecedented sensitivity and much improved temperature sensing circuit 122 SNR (signal-to-noise ratio) inclusive of all noise sources particularly including flicker (1/f) noise and white noise to ensure the temperature estimates are accurate, sensitive, and quantitative at milli-degree level across the entire operational temperature range, which in this exemplary case ranges from −30° C. to 85° C.

Figure 3:
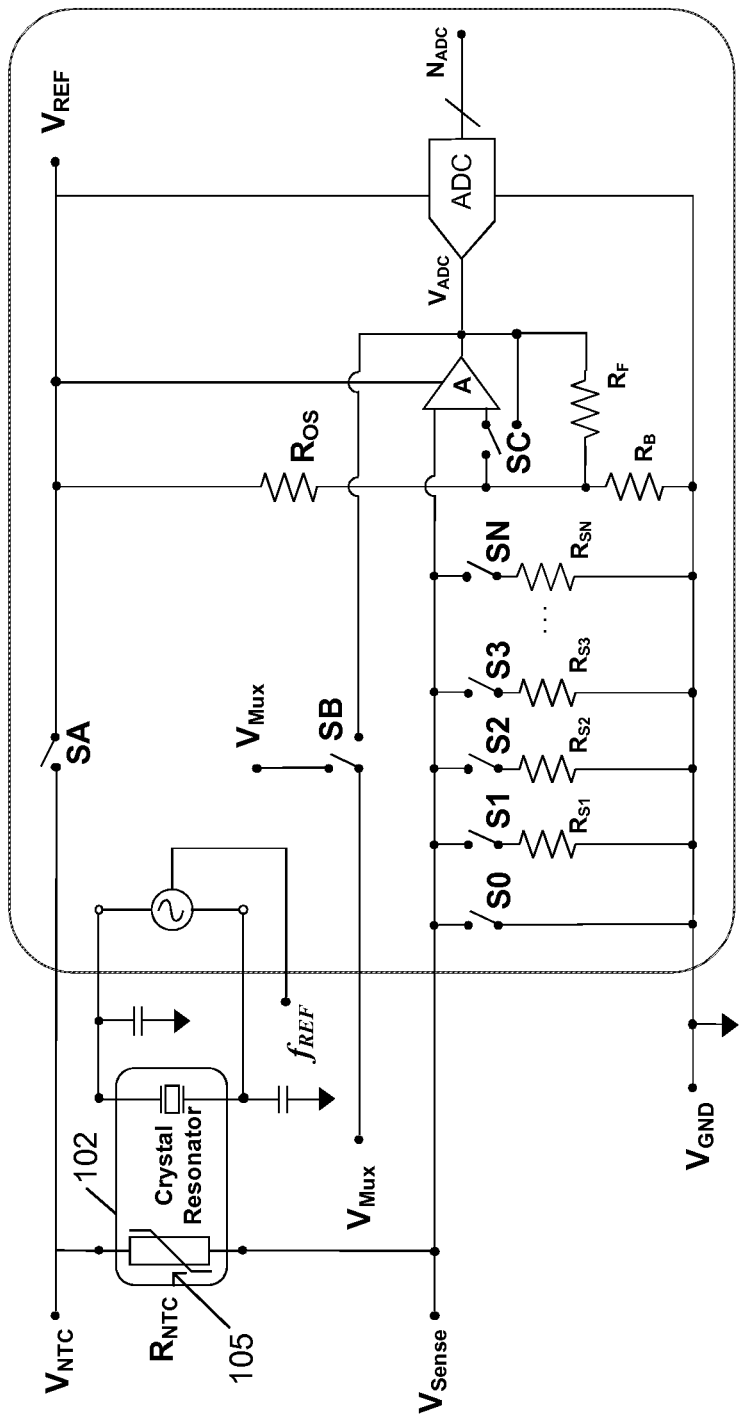
FIG. 3 is a diagram of a hardware configuration for an exemplary embodiment of temperature sensing circuitry associated with the shared crystal oscillator system of FIG. 2.

To this end, a temperature sense and reference oscillator frequency estimate capability is assessed using the hardware configuration of FIG. 3 as a template, in one embodiment. In particular, FIG. 3 is a diagram of hardware configuration for an exemplary embodiment of temperature sensing circuitry 122 and the shared crystal oscillator system (e.g., crystal resonator 102 & crystal oscillator 103) of FIG. 2 in accordance with the present disclosure. It is also used as an exemplary embodiment of factory tuning and calibration of the sensing circuitry 122, as discussed below.

Figure 4:
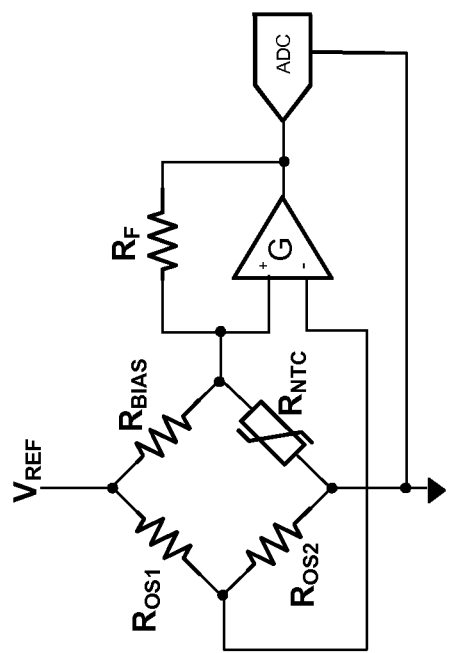
FIG. 4 is a diagram of a hardware configuration for an exemplary embodiment of temperature sensing circuitry incorporating a differential voltage divider design associated with the shared crystal oscillator system of FIG. 2.

The simplified voltage divider in FIG. 3 does not limit embodiments to single-ended designs as depicted in FIG. 3. FIG. 4 illustrates a (differential) voltage divider embedded within a resistive bridge that can be used in an embodiment of the temperature sensing circuit described in the present disclosure. In one embodiment of the differential design, as shown in FIG. 4, the resistor $R_{Bias}$ is nominally equal to the thermistor's nominal resistance $R_N$ and resistors $R_{OS1}$ and $R_{OS2}$ are equal. In this embodiment, for temperatures above $T_0$, the amplifier output is below mid-supply and for temperatures below $T_0$, the amplifier output is above mid-supply. In another embodiment, different $R_{OS1}$ & $R_{OS2}$ resistor values are employed to affect an offset voltage relative to the nominal temperature. In the differential voltage divider implementation of FIG. 4, the multi-$R_{Sense}$ design described in the present disclosure is realized by a set of switchable parallel $R_{Bias}$ resistors.

As previously indicated, the reference oscillator's frequency varies with temperature primarily due to the quartz crystal piezoelectric capacitive resonance and secondarily due to oscillator square-law temperature dependencies. The composite relationship between the crystal's capacitive resonance secondary oscillator effects, and temperature is conventionally described by the cubic polynomial of Equation 1.

$$f_{REF} = p_0 + p_1 T + p_2 T^2 + p_3 T^3 \quad \text{(Equation 1)}$$

The parameters or coefficients ($p_0$, $p_1$, $p_2$, $p_3$) are used to fit a particular quartz crystal resonator-based reference oscillator's temperature-to-frequency deviation characteristic. To provide analytical details of the sensing circuit design, it is necessary to set models that are generally accepted to describe crystal frequency deviation and thermistor temperature frequency relationship in the design.

For characteristics of the temperature sensor or thermistor 105, the Steinhart-Hart equation is generally acknowledged as the most accurate expression to describe a given thermistor's temperature-resistance relationship, which are given by $$\frac{1}{T} = a + b \cdot \ln\left(\frac{R_{NTC}}{R_N}\right) + c \cdot \ln^2\left(\frac{R_{NTC}}{R_N}\right) + d \cdot \ln^3\left(\frac{R_{NTC}}{R_N}\right) \quad \text{(Equation 2)}$$

$$R_{NTC} = R_N \exp\left[A + \frac{B}{T} + \frac{C}{T^2} + \frac{D}{T^3}\right] \quad \text{(Equation 3)}$$

where $R_N$ is a normalizing resistance, usually defined as the thermistor or sensor's resistance at room temperature ($T_0$), expressed in degrees Kelvin (K). In addition, the four parameters (a, b, c, and d) as well as (A, B, C, D) are used to fit a particular thermistor's temperature-resistance characteristics. Although less accurate over large temperature ranges, the following simpler expressions are also employed.

$$\frac{1}{T} = \frac{1}{\beta}\ln\left[\frac{R_{NTC}}{R_N}\right] + \frac{1}{T_0} \quad \text{(Equation 4)}$$

$$R_{NTC} = R_N \exp\left[\frac{\beta(T_0 - T)}{T_0 \cdot T}\right] \quad \text{(Equation 5)}$$

where Beta (β) is given by $$\beta = \frac{T_0 \cdot T}{T_0 - T}\ln\left[\frac{R_{NTC}}{R_N}\right]. \quad \text{(Equation 6)}$$

And the variables $R_{NTC}$, $R_N$, T & $T_0$ are unchanged from their definitions in Equations 2 and 3. For the purpose of the present disclosure the Steinhart-Hart equations (Equations 2 and 3) are used exclusively.

Referring back to FIG. 3, a high level component schematics/design of an exemplary temperature sensing circuit 122 is depicted. Here, a voltage divider is used to translate thermistor resistance variation (versus temperature) to a digitizable voltage. As will be shown subsequently, the thermistor's optimal position in the divider circuit is a function of several variables and thus must be determined based on the specific system's requirements. A non-inverting op-amp (A) is applied as a gain amplifier as well as impedance buffer before an analog-to-digital converter ADC.

To achieve the desired temperature-to-frequency compensation accuracy necessary to meet the aforementioned stringent GPS maximum frequency step size and maximum frequency slew requirements or tolerance, one of the temperature sensing circuit's most important characteristics is the temperature sensing circuit ADC's input voltage sensitivity to frequency variation ($\tilde{S}_{ADC}^{Frequency}$) which is a composite (unnormalized) sensitivity comprised of the following principal elements.

$$\tilde{S}_{ADC}^{Frequency} = G \cdot \frac{\tilde{S}_{Divider}^{Resistance} \cdot \tilde{S}_{R\text{-}Thermistor}^{Temperature}}{\tilde{S}_{XO_{Frequency}}^{Temperature}} = G \cdot \frac{\tilde{S}_{Divider}^{Temperature}}{\tilde{S}_{XO_{Frequency}}^{Temperature}} \quad \text{(Equation 7)}$$

G represents the voltage gain (generally unity or greater) of the amplifier (A) placed between the resistive divider circuit and the Analog-to-Digital-Converter (ADC) used to digitize the temperature sensing circuit's voltage signal. This gain function amplifies the voltage designated $V_{Sense}$.

In addition to the gain function's impedance buffering benefits, gains larger than unity are intended to amplify the temperature sense signal of interest thereby increasing the minimum resolvable voltage required at the ADC input for a stipulated delta-temperature ($\Delta T$) resolution is transformed by way of Equation 7 to a delta-frequency ($\Delta f$), which herein is generally expressed in ppb. The benefits for the overall temperature sensing function are increased ADC effective LSB (least significant bit) voltage and reduced ADC effective number of bits (ENOB). In addition to amplifying the desired signal of interest (i.e. voltage change resulting from thermistor resistance change resulting from the change in thermistor temperature), the amplifier's gain also amplifies noise present cross its input terminals.

Regarding the amplified noise, the temperature sensing circuit's dominant noise sources are generally flicker and thermal noise. Their relative size depends on the spectral frequency range over which the noise source's spectral density is integrated. This spectral frequency range's lower bound is governed by maximum integration/accumulation times employed in the GPS system's internal Delay-Lock-Lock (DLL), Frequency-Lock-Loop (FLL), Phase-Lock-Loop (PLL) and filtering design, etc., and this spectral frequency range's upper bound is governed by the temperature sensing circuit's sample rate. For exemplary purposes, the spectral frequency interval over which the noise sources are integrated is stipulated as 0.2 Hz to 450 Hz. For this exemplary spectral frequency interval, the equivalent (RMS) thermal noise voltage of a 100 kΩ resistor at 85° C. is ~0.95 uV.

Next, assuming the exemplary temperature sensing circuit's ADC is 18-bit for which its Effective-Number-Of-Bits (ENOB) is 16½-bits, then the ADC's theoretical SNR is ~101 dB. Further, assuming the exemplary temperature sensing circuit ADC's maximum input range is 1.2V, the (RMS) noise voltage calculated from the theoretical SNR is ~3.75 uV. For comparison purposes, commercially available low-noise low-power operational amplifiers or op-amps (such as the Texas Instruments OPA333) can achieve an equivalent flicker noise voltage (integrated from 0.2 Hz to 450 Hz) of ~1.25 uV.

As a result, assuming this exemplary temperature sensing circuit's equivalent resistance across the op-amp input is in the vicinity of 100 kΩ and the op-amp's input referred equivalent flicker noise voltage (integrated from 0.2 Hz to 450 Hz) is ~1.25 uV, then the combined thermal and flicker noise at the op-amp input is 1.6 uV (assuming negligible contribution from the op-amp's equivalent input referred (white) voltage and current noise sources). Consequently, for a gain of 2.4 V/V, the contribution from the composite of the thermal noise due to the equivalent resistance across the op-amp (A) input and the op-amp's input-referred flicker noise becomes equal to the aforementioned temperature sensing circuit's ADC noise. As this example illustrates, the temperature sensing circuit's amplifier gain is generally limited by the combined equivalent noise resistance across the amplifier input and the amplifier's input-referred flicker noise.

The equivalent noise resistance across the amplifier input is determined by the parallel combination of the sense/bias resistance ($R_{Sense}$) and the thermistor resistance ($R_{NTC}$) at one amplifier input terminal and the parallel combination of the voltage-offset resistance $R_{oe}$, and feedback resistances $R_F$ and $R_B$ at the other amplifier input terminal.

It can be shown that the magnitude of the divider voltage sensitivity to temperature $S_{Divider}^{Temperature}$ is the same regardless whether $R_{NTC}$ is in the high position (i.e. terminal between $V_{Ref}$ and $V_{Sense}$ or the low position (i.e. terminal between $V_{Sense}$ and GND), and it is given by (assuming $R_{NTc}$ is on top, for example)

$$\tilde{S}_{Divider}^{Temperature} = \frac{\partial V_{Sense}^{Top}}{\partial T} = \frac{-R_{Sense}}{(R_{Sense} + R_{NTC})^2} \cdot \frac{\partial R_{NTC}}{\partial T} V_{Ref} \quad \text{(Equation 8)}$$

where the derivative of $R_{NTC}$ with respect to temperature is determined by referring back to the Steinhart-Hart thermistor resistance versus temperature expression of Equation 3 and is readily shown to be $$\frac{\partial R_{NTC}}{\partial T} = -R_{NTC} \cdot \frac{3D + 2C \cdot T + B \cdot T^2}{T^4}. \quad \text{(Equation 9)}$$

A useful substitution is to define a resistance ratio, designated by the parameter γ and given by $$\gamma = \frac{R_{Sense}}{R_{NTC}}. \quad \text{(Equation 10)}$$

Now substituting $\partial R_{NTC}/\partial T$ (from Equation 9) and γ (from Equation 10) into Equation 8, the voltage divider's sensitivity to temperature evolves to the following form $$\tilde{S}_{Divider\text{-}Top}^{Temperature} = \quad \text{(Equation 11)}$$
$$-\tilde{S}_{Divider\text{-}Bottom}^{Temperature} = \frac{\gamma}{(\gamma + 1)^2} \cdot \frac{3D + 2C \cdot T + B \cdot T^2}{T^4} V_{Ref}.$$

Although it appears a separation of variables has been affected in Equation 11, the temperature dependent thermistor resistance is embedded within γ. On the other hand, it is useful to understand where the largest share of the variation in Equation 11 resides. Although the term in Equation 11 explicitly involving temperature is a (weak) function of thermistor Beta and since the T (temperature) in this term is expressed in Kevin, its variation over the operational temperature range from −30° C. to 85° C., is approximately a linear function of temperature. Therefore, for a stipulated sense resistance and thermistor Beta & thermistor nominal resistance, its total variation is dwarfed by the term involving γ. Thus, for the purpose of optimizing the divider voltage's sensitivity to temperature, the term in Equation 11 explicitly involving temperature is considered a linear temperature-dependent scaling constant (which by the way may still slightly alter the γ value at which optimal sensitivity is achieved but to a lesser degree than altering the value of γ itself). This leaves the γ-term (comprised of the ratio of $R_{Sense}$ over $R_N$) on the right-hand side of Equation 11 as the only parameter in the voltage divider sensitivity to temperature expression that can be tuned at design time and thus merits further attention.

To this end, the voltage divider sensitivity to temperature (Equation 11) is maximized with respect to γ by taking the derivative of Equation 11 with respect to γ and solving for γ when this derivative is set equal to zero. Accordingly, the derivative of Equation 11 with respect to γ is readily shown to be $$\frac{\partial \tilde{S}_{Divider-Top}^{Temperature}}{\partial \gamma} = \frac{1-\gamma}{(\gamma+1)^3} \cdot \frac{3D + 2C \cdot T + B \cdot T^2}{T^4} V_{Ref}. \quad \text{(Equation 12)}$$

Then setting Equation 12 equal to zero, the value of γ at which the divider's maximum (unnormalized) sensitivity to temperature (Max $[S_{Divider-Top}^{Temperature}]$) is obtained is readily shown to be $$\gamma = 1 \quad \text{(Equation 13)}.$$

Figure 5:
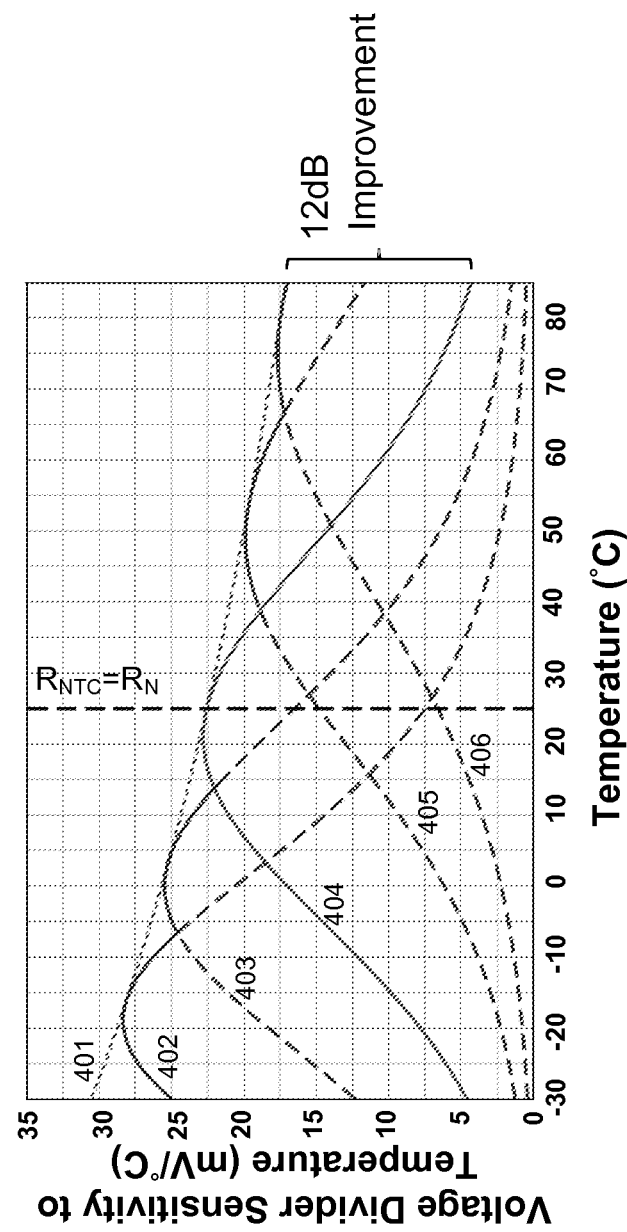
FIG. 5 is a diagram showing a comparison of temperature sensing circuit voltage divider sensitivity over temperature between a conventional single sense/bias resistor design and a multi-sense/bias-resistor design in accordance with an embodiment of the present disclosure.

FIG. 5 illustrates (unnormalized) divider sensitivity to temperature curves versus temperature for three exemplary temperature sensing circuits 122. The exemplary thermistor characteristics are identical for each of the three exemplary temperature sensing circuits 122 of FIG. 5 and represent thermistors having Beta ~4500. The first exemplary temperature sensing circuit (curve-404, curve-504 (FIG. 6)) employs a single sense/bias resistor ($R_{Sense}$) to span the full operational temperature range. The second exemplary temperature sensing circuit (curve-401, curve-501 (FIG. 6)) is an idealized temperature sensing circuit in which the value of γ is one over the full operational temperature range. This is equivalent to having (matched) thermistors 105 in both of the voltage dividers top and bottom positions.

Consequently, the divider sensitivity to temperature is maximum over the full operational temperature range for this idealized temperature sensing circuit 122 (curve-401, curve-501 (FIG. 6)). Although this idealized temperature sensing circuit (curve-401, curve-501 (FIG. 6)) has no practical utility (because its voltage divider sense voltage is constant across the full operational temperature range), this idealized temperature sensing circuit does, however, illustrate how much the divider sensitivity to temperature can be improved relative to the single sense/bias resistor embodiment (e.g., illustrated in FIG. 5 (curve-404) and FIG. 6 (curve-504)). The third exemplary temperature sensing circuit of FIG. 5 consists of the composite of five curves (curve-402, curve-502 (FIG. 6); curve-403, curve-503 (FIG. 6); curve-404, curve-504; curve-405, curve 505 (FIG. 6); and curve-406, curve-506 (FIG. 6)), hereafter designated as curve 507 in FIG. 6, and is one possible embodiment of the present disclosure in which five (switched) sense/bias resistors—each comprised of unique and fixed resistance values—are incorporated into the temperature sensing circuit with each of the five (switched) sense/bias resistors designed to span only a portion of the temperature sensing circuit's full operational temperature range with the composite of these five portions of the temperature sensing circuit's full operational temperature range collectively providing continuous coverage across the temperature sensing circuit's full operational temperature range.

The exemplary multi-$R_{Sense}$ temperature sensing circuit (curve 507) demonstrates significant advantages of embodiments of the present disclosure's multi-$R_{Sense}$ temperature sensing circuit architecture relative to the exemplary single-$R_{Sense}$ temperature sensing circuit (curve 504). The multi-$R_{Sense}$ temperature sensing circuit's minimum voltage sensitivity to temperature across the full operational temperature range is approximately 4 times larger than the prior art's single-$R_{Sense}$ temperature sensing circuit's (curve-504) minimum voltage sensitivity, i.e. ~25 mV/° C. at −30° C. & ~17 mV/° C. at 85° C. for multi-$R_{Sense}$ temperature sensing circuit versus ~4.3 mV/° C. at −30° C. & ~4.6 mV/° C. at 85° C. for the single-$R_{Sense}$ temperature sensing circuit, representing improvements better than 14.6 dB & 11.9 dB at −30° C. & 85° C., respectively.

Figure 6:
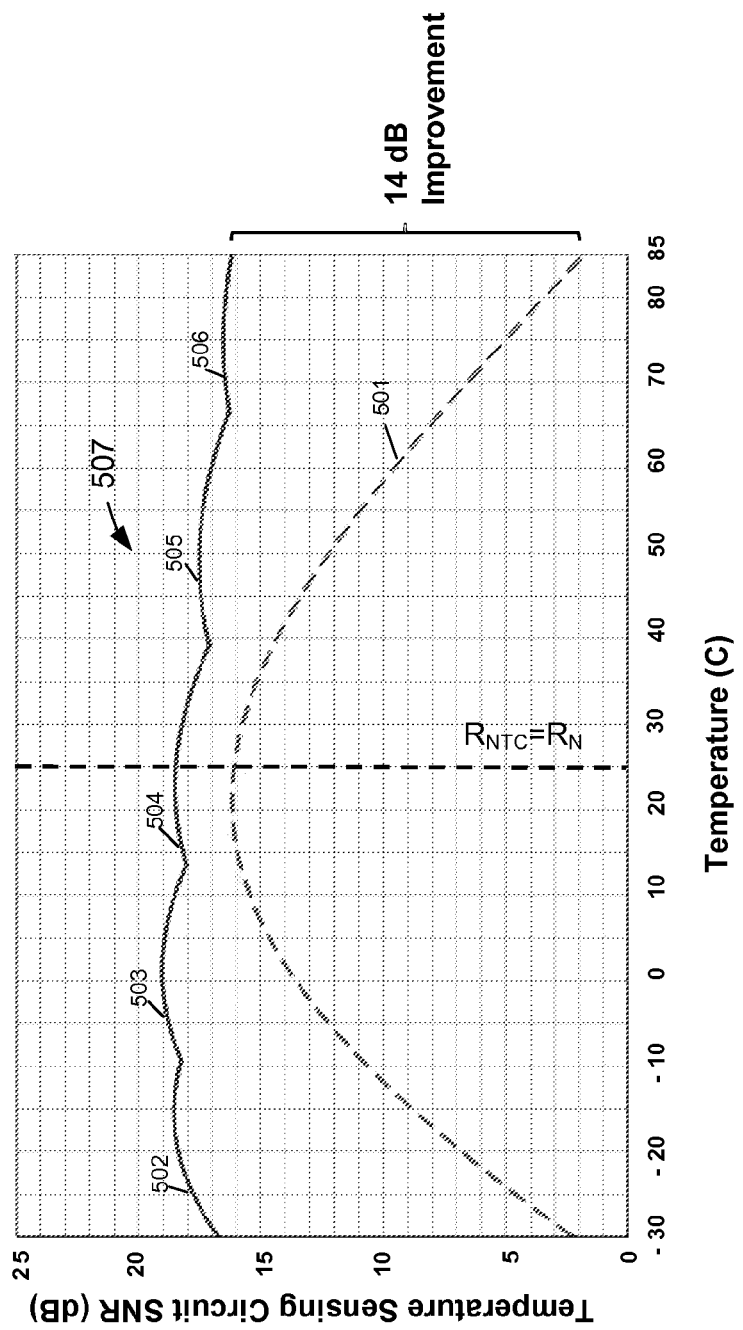
FIG. 6 is a diagram showing a comparison of a temperature sensing circuit SNR (signal-to-noise ratio) over temperature between a conventional single sense/bias resistor design and a multi-sense/bias-resistor design in accordance with an embodiment of the present disclosure.

FIG. 6 illustrates the exemplary temperature sensing circuit's (ADC input-referred) Signal-to-Noise-Ratio (SNR) at ADC for both the single sense/bias resistor design of the prior art as well as an embodiment of the present disclosure's multi-sense/bias resistor design. The single-$R_{Sense}$ & multi-$R_{Sense}$ temperature sensing circuit designs employ gains of 1.1 V/V & 1.8V/V, respectively. The single-$R_{Sense}$ and design's gain are lower, since these exemplary temperature sensing circuits assume fixed gain and voltage offset, which ultimately results in the total permissible ADC input voltage range limiting the single-$R_{Sense}$ temperature sensing circuit's maximum gain. This is not the case for the fixed gain and fixed voltage offset instantiations of multi-$R_{Sense}$ temperature sensing circuit architecture 122 of the present disclosure.

Regardless, as FIG. 6 illustrates, this embodiment of multi-$R_{Sense}$ temperature sensing circuit architecture improves the sensing circuit's minimum SNR more than 14 dB (in the vicinity of the −30° C. and 85° C. temperature extremes) relative to the prior art's single-$R_{Sense}$ temperature sensing circuit architecture. For both designs, the noise integration bandwidth is, but not limited to being, from 0.2 Hz to 450 Hz; the previously indicated 3.75 uV was used as, but not limited to being used as, the ADC input noise; and the commercially available Texas Instruments OPA333 operational amplifier's noise characteristics were assumed, but not limited to being assumed, for the gain amplifier.

The crystal resonator based reference oscillator's frequency sensitivity to temperature $S_{XO-Frequency}^{Temperature}$ in Equation 7 is simply the derivative of Equation 1 with respect to temperature, and can be expressed as $$\tilde{S}_{XO-Frequency}^{Temperature} = \frac{\partial f_{REF}}{\partial T} = p_1 + 2p_2 T + 3p_3 T^2. \quad \text{(Equation 14)}$$

However, it is important to also recognize the parameters $p_1$, $p_2$, and $p_3$ in Equation 14 are not fixed across the entire population of crystal resonators but instead vary unit-to-unit for any given crystal resonator type. Consequently the (unnormalized) crystal resonator-based reference oscillator's frequency sensitivity to temperature varies as functions of both temperature and the crystal resonator's third-order polynomial model parameter's unit-to-unit variation.

Collectively, through a combination of well defined subordinate sensitivity expressions, Equation 7 establishes an analytic relationship between temperature-induced thermistor resistance variation that is observed and digitized by the temperature sensing circuit's ADC input voltage and temperature-induced quartz crystal resonator-based reference oscillator frequency variation. Furthermore, through the sensitivities also described by Equation 7; conventional circuit & noise analysis; and the crystal resonator-based reference oscillator frequency deviation versus temperature third-order polynomial model, the means are available for optimizing the principal elements of the present disclosure's frequency versus temperature compensation accuracy, including but not limited to the temperature sensing circuit and frequency versus temperature model's performances.

Figure 7:
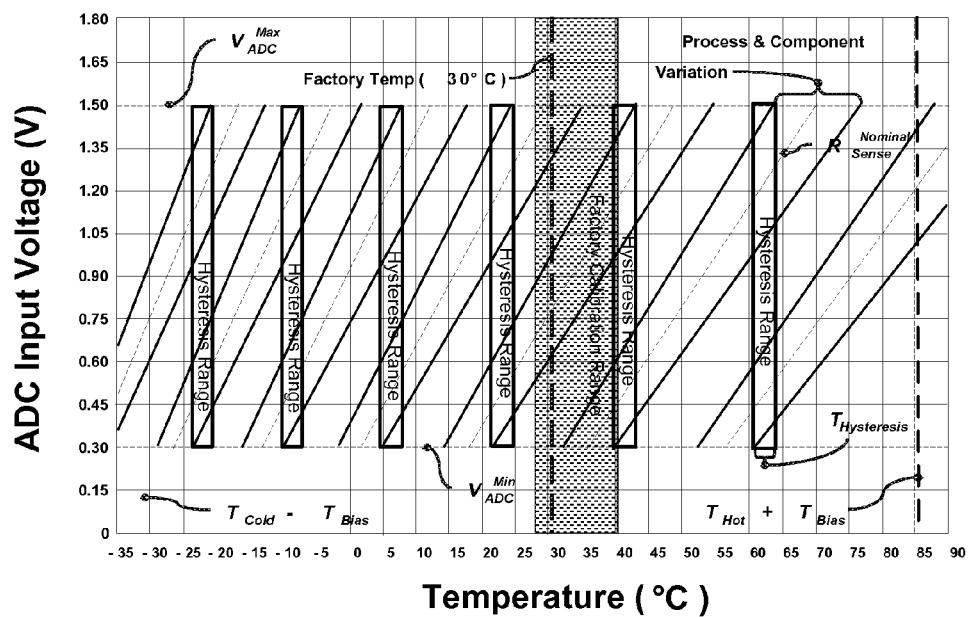
FIG. 7 is a diagram showing a switched multi-sensor/bias-resistor design with an un-tuned resistance value for sense resistors in accordance with an embodiment of the present disclosure.

FIG. 7 illustrates an exemplary temperature sensing circuit 122 in which a switched sense resistor array design is employed, with each sense resistor designed to cover only a portion of the entire operational temperature range, while the collective (seven) sense resistors span the temperature sensing circuit's full operational temperature range. The dashed line corresponding to each sense resistor depicts that sense resistor's nominal temperature span. The two lines nearly symmetric about and approximately parallel to each sense resistor's nominal (dashed) line illustrate the significant accommodation that must be made to account for process variation.

In this exemplary sensing circuit implementation the following variation parameters are assumed: thermistor nominal resistance variation: ±10%, (integrated) sense resistance variation: (pre-tuning ±20% & after tuning ±2½%), supply voltage variation: ±5%, gain variation: ±%% and output offset voltage variation: ±150 uV. Furthermore, sufficient overlaps are included at minimum and maximum resistance for each switching region to ensure smooth transition between regions over resistors' process variation.

An additional feature of the present disclosure is depicted in this exemplary temperature sensing circuit 122 by the incorporation of the narrowly spaced vertical lines proximal to each sense resistor switching boundary. These narrow regions form dedicated overlap regions which are used to force a sort of hysteresis when the temperature transitions across any of these sense resistor boundaries. Specifically, while traversing these dedicated hysteresis lanes, either with or without an increased sample rate, the sensing circuit 122 can alternately sample the present sense resistor during one cycle and then sample the approaching sense/bias resistor during the following cycle.

Fortunately, a given crystal resonator's maximum frequency slew occurs at the temperature extremes. In fact, over the range −15° C. to +70° C., the maximum frequency slew is no more than half the crystal resonator's maximum frequency slew at the −30° C. and +85° C. temperature extremes for most crystal resonators of interest. For the exemplary temperature sensing circuit 122 of FIG. 7 however, the coldest sense resistor range transition occurs below −20° C. and accelerated sampling may be merited. However, as will be shown momentarily, exemplary temperature sensing circuit embodiments of the present disclosure entirely avoid sense resistor range transitions outside the previously indicated −15° C. to +70° C. temperature range within which the crystal's maximum frequency slew is less than half its maximum frequency slew at the −30° C. and +85° C. temperature extremes.

Regardless, the dedicated sense resistor overlap lanes in FIG. 7 facilitate determination of any (post-calibration) residual offset between sense/bias regions, which can be compensated before transitioning from the present sense resistor region to the approaching sense/bias resistor region. As a result, unintended discontinuous frequency steps are avoided as any residual offset between regions is compensated before frequency error estimates are generated from the approaching sense resistor region's data. Hereafter, these dedicated overlap lanes in FIG. 7 are referred to as hysteresis ranges.

Now, returning to the exemplary temperature sensing circuit 122 of FIG. 7, surprisingly, integrated resistor tuning (discussed momentarily) is employed in this exemplary temperature sensing circuit 122 to within 2½%. In spite of this, the post-tuning process variation still requires seven distinct sense/bias resistance regions. However, the culprit is not the variation associated with the integrated sense resistors. Instead, its cause is rooted in the technique used to tune the integrated sense resistance values.

Specifically, the particular thermistor's nominal resistance is assumed to be unknown in this exemplary temperature sensing circuit 122. As was demonstrated by Equations 10 through 13, optimal performance is achieved when each sense resistor value is defined as a target γ value, which was defined in Equation 10 as the ratio of the sense resistance ($R_{Sense}$) divided by the thermistor's nominal resistance ($R_N$). Consequently, when the particular thermistor nominal resistance value is unknown, each sense/bias resistor is tuned to the thermistor's target nominal resistance value, thereby inducing considerable unnecessary variation in the tuned γ value.

In general, resistor calibration processes may be performed in an integrated circuit manufacturing facility, in some embodiments, such as a facility where the GPS 108 and/or cellular system's integrated circuits 104, 106 are fabricated. In other embodiments, calibration may alternately be performed in a mobile communications device manufacturing facility or factory. Further, some embodiments may perform some aspects of calibration procedures at the integrated circuit (IC) manufacturing facility, while performing other aspects of calibration procedures in a mobile/communications manufacturing facility or factory.

Figure 8:
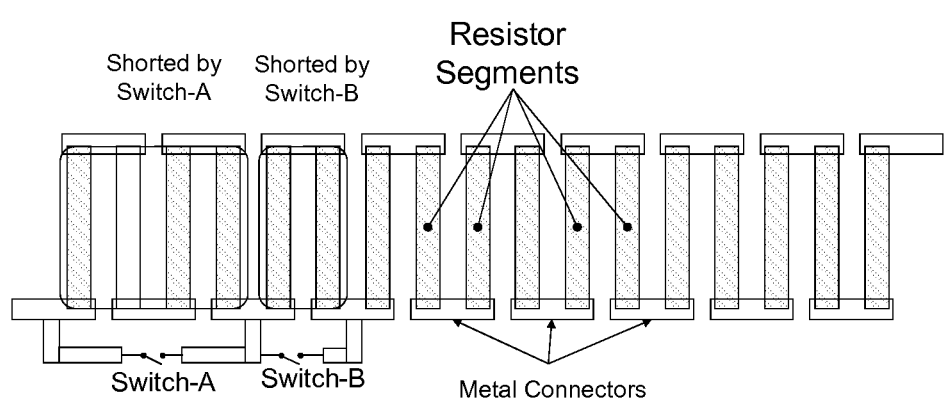
FIG. 8 is a diagram illustrating a technique for resistor tuning in accordance with an embodiment of the present disclosure.

In one embodiment, the temperature sensing circuit's switched sense resistor(s) are incorporated in the integrated circuit. In this embodiment, respectively assuming ±20% and ±10% as the exemplary integrated circuit sheet resistance process and thermistor nominal resistance component variations, for a given target ($R_{Sense}/R_N$) resistance ratio (γ), the integrated sense/bias resistors must be tunable for the worse-case combinations (i.e. 80%/110% and 120%/90%). This is accomplished using resistor tuning segments as illustrated in FIG. 8.

In this figure, Switch-A & Switch-B are generally realized using transistors sized to have sufficiently small on-state resistance, such that the resistance through the transistor path is substantially smaller than the resistance segment it electrically shorts out. Thus, these transistors can be configured during temperature sensing circuit calibration & tuning to either a high-impedance off-state or to a low-impedance on-state. In the low-impedance state, the transistor-based switch effectively bypasses (or shorts out) the resistance segment paralleling the transistor based switch.

As a result of the above described sheet resistance & thermistor nominal resistance variation, in one embodiment, each sense/bias resistor is designed for >=138% of its target value while being tunable down to <=75% of its target value. This is equivalent to tuning from a maximum resistance of 184% down to a target resistance of 100%. Now let $R_{Max}$=184%, $R_{Target}$=100%, and further assume this exemplary target tuned resistance ratio tolerance is ±2%, where this resistance ratio tolerance is designated as $\delta R_{Min}$ (i.e. $\delta R_{Min}$=0.02). Thus, for this exemplary sense/bias resistor tuning scenario, the number of required tuning states ($N_{States}$) is given by $$N_{States} = \text{Ceiling}\left[\frac{R_{Max} - R_{Target}}{\delta R_{Min}} + 1\right] = \text{Ceiling}\left[\frac{1.84 - 1.0}{0.02} + 1\right] = 43. \quad \text{(Equation 15)}$$

More importantly, provided these tuning states are implemented in binary fashion, the number of tuning bits per sense/bias resistor is given by $$N_{Bits} = \text{Ceiling}\left(\frac{1}{\text{Log}_2\left[\frac{R_{Max} - R_{Target}}{\delta R_{Min}} + 1\right]}\right) = \text{Ceiling}\left(\frac{1}{\text{Log}_2\left[\frac{1.84 - 1.0}{0.02} + 1\right]}\right) = 6. \quad \text{(Equation 16)}$$

Then, assuming this exemplary temperature sensing circuit 122 is comprised of six sense resistors, a total of 36 resistor tuning segments is required, which poses neither die size nor complexity concerns. In one embodiment, after the silicon integrated circuit (IC) has been reconfigured (i.e. sense resistor tuning invoked) such that each sense resistance falls within the exemplary tolerance, each sense resistor is measured again (for example to 5½ digit accuracy using the four probe method). These final sense resistor values are then sent to and retained by the silicon IC as the final sense resistor values. The fine tuning of a sense resistor resistance value has significant impact on the temperature sensing circuit design in terms of number of temperature sub-regions.

Figure 9:
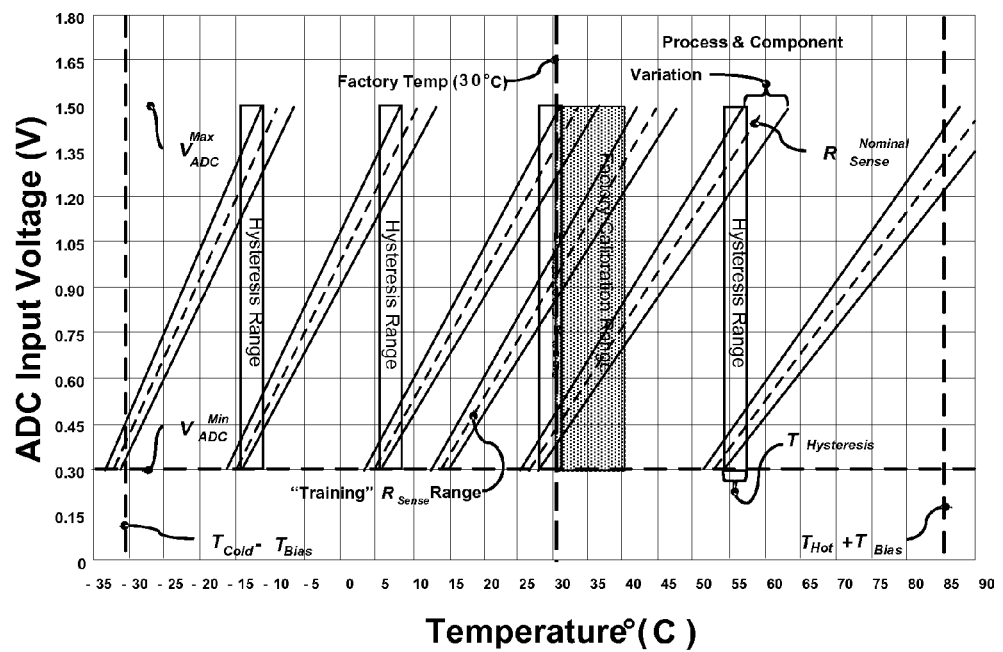
FIG. 9 is a diagram showing a switched multi-sensor/bias-resistor design with a tuned resistance value for sense/bias resistors in accordance with an embodiment of the present disclosure.

For example, FIG. 9 illustrates the same design as in FIG. 7, except the sense resistors have much smaller process variation after the tuning. It can be seen that the margin required to account for resistor process variation is much smaller than that in FIG. 7, and as a result the number of temperature regions is reduced compared to FIG. 7.

In another temperature sensing circuit embodiment, when implemented in the integrated circuit, the temperature sensing circuit 122 can be implemented with the configuration switches (SA, SB, SC & S0, S1, S2, ... SN) as indicated in FIG. 3, where N is generally 6 or less. In addition, the external (4-point) probe pads, also indicated in FIG. 3, can be incorporated into the printed circuit board (PCB) onto which the integrated circuit incorporating this exemplary temperature sensing circuit 122 resides. These accommodations enable very accurate and high-speed calibration of this exemplary multi-$R_{Sense}$ temperature sensing circuit embodiment.

One embodiment of a fine calibration setup may be performed, where $V_{Sense}$ (FIG. 3) can be connected with a cellular phone factory calibration test fixture and connection pads are available at $R_{NTC}$ (FIG. 3) for connecting factory precision resistance reading, as well as precision voltage reading. In addition to the switches used during normal operation to switch the sense resistors as the temperature sensing circuit 122 transitions to different temperature regions, a $V_{REF}$ switch is also utilized in the chip (IC), for some embodiments.

In one exemplary embodiment, to fine calibrate $R_{NTC}$, all internal sense resistor switches and the $V_{REF}$ switch are set to open, and the switch S0 is closed to short $V_{Sense}$ and GND. The $R_{NTC}$ resistance can then be measured directly, since any other possible resistance at the same measuring pads is disconnected. The ADC input impedance is also considered infinite due to the operational amplifier (A).

Advantages of the temperature sensing circuit accommodations depicted in FIG. 3 are plentiful. First, the combination of switches SA & S0 through SN allow the thermistor 105, depicted in FIG. 3, to be electrically isolated from the integrated circuit of FIG. 3 with the 4-point probe pads located in the vicinities of terminals $V_{NTC}$ and $V_{Sense}$ facilitating accurate and rapid measurement of the thermistor resistance (from which the thermistor's nominal resistance can be calculated). Further, the remainder of this exemplary temperature sensing circuit's resistances, gain, & offset voltages can be calibrated using commercially available high-speed 5½ or 6½ digit accuracy digital multi-meters. This coupled with a temperature measurement accurate within ±½° C. for bias enable an accurate estimate of the particular thermistor's nominal resistance (limited primarily by the temperature measurement uncertainty). For example, a ~4500 Beta thermistor varies ~4.8%° C. in the vicinity of 30° C.; therefore, the thermistor's nominal resistance can readily be estimated to within 2.5% assuming temperature bias is within ±½° C. Furthermore, it can be shown that this 2.5% thermistor nominal resistance uncertainty does not necessarily translate into a corresponding temperature measurement uncertainty, where the calibrated temperature sensing circuit is also used for temperature measurement of the factory frequency-temperature pair measurements used to calibrate the crystal resonator-based oscillator temperature-to-frequency model.

Instead, provided the crystal resonator's calibration (discussed subsequently) employs the fully calibrated temperature sensing circuit 122 to estimate the crystal resonator's temperature during the crystal resonator's frequency versus temperature third-order polynomial model calibration and parameter extraction, the aforementioned temperature bias is incorporated into a temperature offset term in an alternate representation of a general third-order polynomial model (also discussed subsequently). With this in mind and provided the thermistor resistance and other temperature sensing circuit resistances & voltages are measured with sufficient accuracy, the apparent thermistor nominal resistance uncertainty reduces to approximately <0.8%.

In one embodiment each of the multi-$R_{Sense}$ temperature sensing circuit's sense/bias resistances are tuned to a target resistance ratio $\gamma_{Target}$ such that $$R_{Sense}^{Target} = \frac{\gamma_{Target}}{R_N^{Cal}} \quad \text{(Equation 17)}$$

wherein $R_N^{Cal}$ represents the thermistor's calibrated nominal resistance. When this method is employed to tune the temperature sensing circuit's sense/bias resistors, the accommodation necessary for post-tuning process variation reduces substantially as illustrated in the exemplary temperature sensing circuit 122 of FIG. 9. In fact, the gains for the exemplary temperature sensing circuits 122 of FIGS. 7 and 9 are identical. Thus, the calibration method of this embodiment (depicted in FIG. 10) is responsible for reducing margin required to accommodate post-tuning process variation. Quantitatively, this method is responsible for reducing the number of required sense/bias resistors from seven to five with no sacrifice in either sensitivity or SNR. The resistance for each resistor in the array can be calibrated one by one with its corresponding switch closed using a similar approach. The $V_{REF}$ switch and $R_{s0}$ switch are open during this calibration, in one embodiment.

Referring to Equations 10-13, it is evident the $R_S/R_N$ ratio is of much importance in temperature estimation. Thus, as part of the disclosure described herein, instead of calibrating thermistor $R_N$ and serial resistors $R_S$ independently as previously described, it is more efficient to calibrate the $R_S/R_N$ ratio to be within a certain percentage of the calibrated $R_N$ value. When $R_S$ is calibrated independently of $R_N$, the resistance of $R_S$ can vary over +/−5% with accuracy of 0.1%, for example, after the procedure described previously. If $R_N$ has variation over 10%, then the $R_S/R_N$ ratio can vary +/−15% worst case with 0.1% accuracy. When $R_S$ is calibrated, as in a ratio of $R_S/R_N$ within 2% of its target with 0.1% accuracy, the worst case $R_S/R_N$ variation is guaranteed to be within 4% (the creep is due to the previously described thermistor nominal resistance uncertainty). The lower the variation, the more margin of voltage range can be allocated in each resistor switching region, e.g., less regions required to span a given full operating temperature range.

A sixth and substantially redundant sense resistor (third from the right-hand side of FIG. 9) is incorporated in the temperature sensing circuit 122 of FIG. 9. This largely redundant sense resistor is designated the "training" resistor and is incorporated largely to maximize temperature sensitivity during factory calibration. For the embodiment depicted in FIG. 9, the training resistor's temperature sensitivity to frequency is approximately 25% higher than nominal sense/bias resistors located (in the figure) adjacent to this training resistor. Thus, over the anticipated factory calibration temperatures, this training resistor's sensitivity is maximum and its value is chosen so as to avoid range switching during the full crystal resonator's frequency versus temperature calibration (discussed subsequently) and interleaved with existing factory RF tuning measurements. In some embodiments, one of the nominal sense resistors is positioned (along the temperature axis) such that no further advantage can be achieved with a training resistor and in those cases a training resistor is not considered. Conversely, when a sense resistor range transition is proximal to the anticipated factory calibration temperature range, its benefits are clear.

In some embodiments, multiple $R_{Sense}$ states are implemented as parallel resistors, while in other embodiments, multiple $R_{Sense}$ states are implemented as serial resistors with switchers to connect or bypass the resistors, where a large tuning range can be achieved.

Furthermore, a sense resistor's resistance value $R_S$ also varies over temperature (commonly referred to as the resistor's temperature coefficient of resistance or $t_{CR}$), though at a much slower rate compared to the thermistor 105. Consequently, for all sense/bias resistors nominally operated at temperatures substantially removed from room temperature their $\gamma_{Target}$ (i.e. $R_{Sense}/R_N$) value is compensated to account for the resistor's $t_{CR}$ and the temperature differential between the particular sense resistor's nominal operating temperature and room temperature (i.e. the temperature at which the measurements are performed). In this way, the $R_S/R_N$ ratio under nominal operating conditions is the desired (uncompensated $\gamma_{Target}$) value, even though the sense resistance was tuned at room temperature.

In exemplary embodiments, the temperature sensing circuit's calibration is performed in parallel with the cellular baseband's calibration. The dominant characteristic time of this temperature sensing circuit calibration is communication between a test equipment controller and a mobile or electronic device being calibrated, whether the controller is giving instructions or requesting data. It is noted that the overall impact of the characteristic times depends on the specific calibration procedure sequence. To this end, the following list highlights an exemplary initial temperature sensing circuit calibration sequence:

1. Configure test equipment and mobile device for temperature & thermistor resistance measurements.
2. Execute temperature & thermistor resistance measurements.
3. Calculate thermistor nominal resistance from measured temperature & thermistor resistance data.
4. Measure un-tuned sense resistances (repeat N times, where N equals number of sense resistors).
5. Configure test equipment and mobile device for the $i^{th}$ sense resistor resistance measurement.
6. Execute sense resistance measurement.
7. Calculate each sense resistor's target value based on calculated thermistor nominal resistance.
8. Calculate tuning state for each sense resistor based on their respective measured and target values.
9. Instruct mobile device to assert each sense resistor's tuning state.
10. Measure tuned sense resistances (repeat N times, where N equals number of sense resistors).
11. Configure test equipment and mobile device for the $i^{th}$ sense resistor resistance measurement.
12. Execute sense resistance measurement.
13. Configure test equipment and mobile device for amplifier output offset voltage measurement.
14. Request mobile device perform a $V_{ADC}$ measurement and send result to test equipment controller.
15. Execute amplifier output offset voltage measurement by a digital multimeter (DMM).
16. Configure test equipment and mobile device for amplifier gain measurement.
17. Request mobile device perform a $V_{ADC}$ measurement and send result to test equipment controller.
18. Execute amplifier gain measurement by DMM (i.e. DMM measurement of $V_{Sense}$ and $V_{ADC}$).
19. Send to and instruct mobile device to save: thermistor nominal resistance, all tuned sense resistances, amplifier gain & amplifier output voltage offset.
20. Configure test equipment for nominal temperature sense measurement.
21. Instruct mobile device to perform nominal temperature estimate and to send result to controller.
22. Execute $V_{REF}$, $V_{Sense}$, & $V_{ADC}$ (a.k.a. $V_{MUX}$) DMM measurements and calculate temperature estimate.
23. Compare controller and mobile device temperature estimates and set status (i.e. success/failure).
24. Communicate to mobile device temperature sensing circuit calibration completion and status.

Assuming the temperature sensing circuit 122 in question is comprised of six sense resistances, the total calibration time would be about 2.5 seconds, for example. However, once the "optimal" procedure is identified, both the hardware (HW) configuration state sequence and the dwell time at each HW configuration state remain substantially unchanged thereafter. Consequently, in one embodiment, most of the communication between the test equipment controller and the mobile device may be eliminated by implementing, within the IC, a temperature sensing circuit HW configuration and measurement sequencer, where the HW configuration sequence, as well as the dwell time at each configuration, could be programmable. Again, assuming six sense resistors, the sequencer may eliminate many communications between the test equipment controller and the mobile device indicated in the procedure listed above—thereby reducing the total temperature sensing circuit test time from ~2.5 seconds to less than ¾ second, with further reduction likely. This test time reduction is desirable, even though this sequencer is used to perform the temperature sensing circuit calibration in parallel with existing cellular calibrations.

Figure 10:
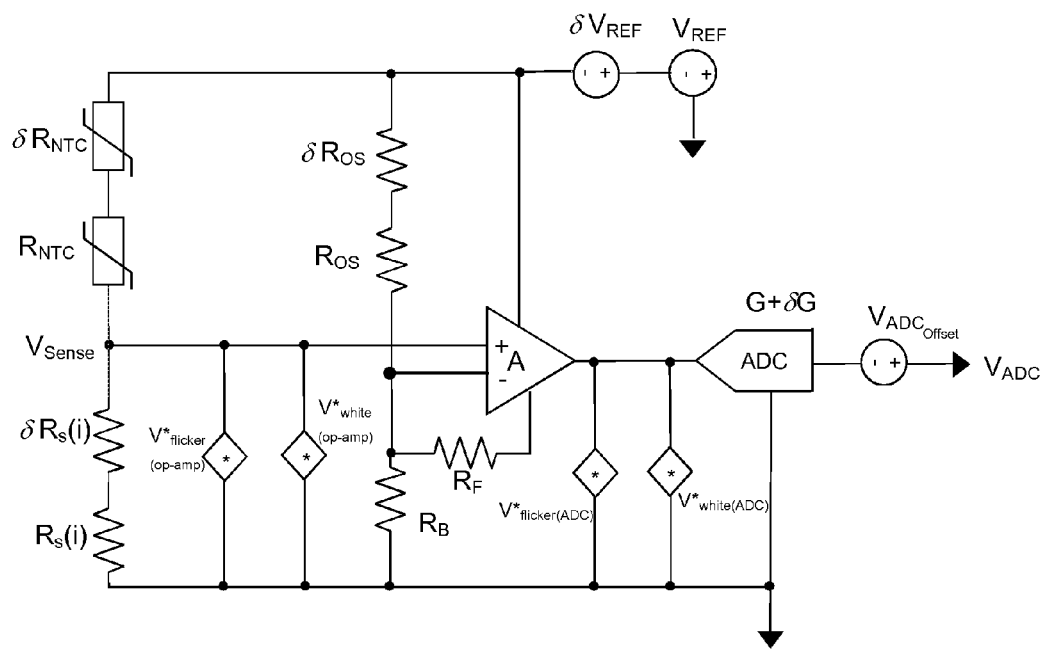
FIG. 10 is a diagram illustrating an embodiment of an exemplary configuration used to calibrate gain and offset for temperature sensing circuitry in accordance with an embodiment of the present disclosure.

Once the thermistor and temperature sensing circuit sense resistors are calibrated, the test fixture, equipment, or the previously described sequencer can switch the connection to continue the calibration of the gain and offset, as shown in FIG. 10. During this calibration, the $V_{REF}$ switch remains open, while $R_{s1}$ is connected. The voltage values at ($V_{Sense1}$ and $V_{Sense2}$) at $V_{Sense}$ terminal of FIG. 3 are applied and the corresponding ADC output ($V_{ADC1}$ and $V_{ADC2}$) are read and recorded. The gain and offset error can be computed as $$\partial G = \frac{V_{ADC_1} - V_{ADC_2}}{(V_{Sense_1} + \partial V_{Sense_1}) - (V_{Sense_2} + \partial V_{Sense_2})} - G \quad \text{(Equation 18)}$$

$$\partial V_{ADC_{offset}}(G+\partial G)(V_{Sense_1}+\delta V_{Sense_1})-V_{ADC_1} \quad \text{(Equation 19)}.$$

In some embodiments, the temperature sensing circuit calibrations can be accomplished by chipset internal measurements and computation only.

Having described an embodiment of the design and associated calibration for the multi-resistor temperature sensing circuit 122 in accordance with present disclosure, a next step is to describe the improved crystal resonator-based oscillator's frequency temperature characteristic curve fitting. As shown in Equation 1, the crystal resonator-based oscillator's frequency deviation is typically modeled by a third-order polynomial equation. Although an upper and lower bound of the frequency deviation are usually provided by crystal manufacturers, the true frequency deviation, as a function of the temperature, can vary substantially from unit to unit. To understand a particular vendor's crystal characteristics, a small representative quantity of samples are usually obtained from the vendor, characterized, and studied in detail.

In common practice, a single set of $3^{rd}$ order polynomial parameters (coefficients) is used to fit the crystal resonator-based reference oscillator frequency deviation versus temperature to a general third-order polynomial spanning across the entire temperature region of −30° C. to 85° C. Thus, it is important to consider why such a conventional model is inadequate in the present application. This consideration is dominated by the two key and stringent GPS system requirements that were identified earlier in this disclosure:

All reference oscillator discontinuous steps must never exceed a specified maximum which for exemplary purposes has been stipulated a value of 3 ppb.

The reference oscillator's frequency deviation (relative to an ideal fixed reference) accumulation rate must never exceed a specified maximum, which also, for exemplary purposes, has been stipulated a value of 10 ppb/sec. Due to practical thermal mass and maximum power dissipation considerations, it is generally safe to stipulate ½° C./sec as an upper bound on mobile communication system temperature slew. Therefore, the maximum reference oscillator frequency slew can be re-expressed as a maximum reference oscillator frequency deviation accumulation rate with respect to temperature whose exemplary maximum value is stipulated as 20 ppb/° C.

Now, in one embodiment, these considerations are applied to the task of temperature compensating a free-running crystal resonator-based reference oscillator 103 whose absolute frequency deviation from temperature drift can be as large as 10 to 15 ppm. As the previous multi-$R_{Sense}$ temperature sensing circuit discussions and illustrations of the present disclosure have illustrated, achieving 1 m° C. (that's one millidegree Centigrade) temperature sensing circuit repeatability is entirely feasible. This capability is well-aligned with candidate crystal resonator-based reference oscillator's maximum frequency slews of nearly 1000 ppb/° C. This capability coupled with maximum mobile communications system temperature slews of ½° C./sec and ~500 Hz temperature sensing circuit effective sample rates make it entirely feasible to ensure the maximum reference oscillator discontinuous step is satisfied with even conventional fixed parameter general third-order polynomial fits for the crystal resonator-based reference oscillator 103.

Consequently, the absolute error is not of a concern even with a single segment fit (i.e. $3^{rd}$ order polynomial parameters fixed over entire operational temperature range) where the absolute error can be over +/−200 ppb. These (relatively) slowly evolving errors are readily estimated and compensated by existing GPS filtering capabilities. Instead, the genuine concern is the maximum error accumulation rate, which for the crystal resonator-based reference oscillator model is best expressed in terms of frequency error accumulation per degree Centigrade (i.e. the exemplary value of 20 ppb/° C.), as these units are natural for a model of frequency versus temperature and are equivalent to the derivative of frequency versus temperature.

Figure 11:
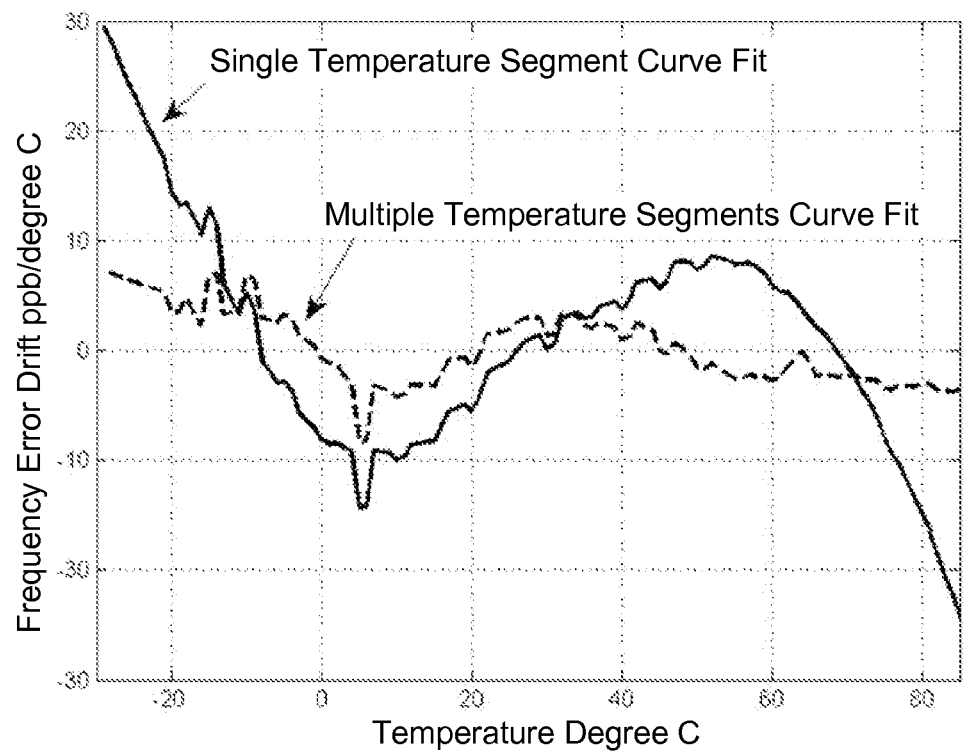
FIG. 11 is a diagram comparing slew of a frequency error from a temperature-to-frequency curve fitting and a conventional single-segment model versus a multi-segment model in accordance with an embodiment of the present disclosure.

From a system perspective, it may be appropriate to view the exemplary maximum frequency error accumulation value of 20 ppb/° C. as the GPS system budget total that is allocated to a variety of frequency error accumulation sources, of which the crystal resonator-based reference oscillator model receives the lion's share of the budget. In this exemplary embodiment, the crystal model is allocated 14 ppb/° C. (70% of the total budget). As shown in FIG. 11, the conventional third-order model is found to consistently exceed the frequency error accumulation budget, as illustrated by the solid curve of FIG. 11.

This situation became the impetus for developing third-order polynomial model improvements that not only satisfy the 14 ppb/° C. frequency error accumulation allocation but also can be formulated in a manner that ensures the entire production crystal frequency versus temperature model can be analytically extracted from minimal factory measurements compatible with the existing factory RF tuning and calibration measurement thermal profile. The first step in this direction is to transform the general cubic polynomial of Equation 1 to a form involving an offset variable $T_0$ in which the quadratic term is suppressed as given by $$f_{REF}=p_0'+p_{1'}(T-T_0)+p_3'(T-T_0) \quad \text{(Equation 20)}.$$

This formulation is not new as it is attributed to Cardan (1501-1576). In fact, there is a one-to-one correspondence between parameters $p_o$, $p_1$, $p_2$, and $p_3$ of Equation 1 and parameters $p_0'$, $p_1'$, $T_0$, and $p_3'$ of Equation 20. The $T_{Offset}$ cubic polynomial formulation has two distinct advantages over the conventional ($p_0$, $p_1$, $p_2$, and $p_3$) cubic polynomial formulation of Equation 1. First, in all frequency versus temperature measurements, there is an inherent temperature bias and, by employing the $T_{Offset}$ cubic polynomial formulation, an additional variable is not required to account for this uncertainty. As previously indicated, there is also a fortuitous (linear) correspondence between thermistor 105 calibrated normalization resistance and temperature offset (provided the temperature sensing circuit and thermistor nominal resistance are calibrated with sufficient accuracy). This is in spite of the seemingly (strong) nonlinear relationship between thermistor resistance and temperature embodied in the Steinhart-Hart equations (Equations 2 & 3).

The second distinct advantage of the $T_{Offset}$ cubic polynomial formulation is that its derivative with respect to temperature (T) is a parabola, wherein the parabola is symmetric about $T_{Offset}$. By calibrating the thermistor normalization resistance and the full temperature sensing circuit 122 (with the appropriate precision) prior to performing the crystal model's frequency-temperature parameter extraction measurements and further employing the temperature sensing circuit 122 for the temperature measurement portion of the aforementioned frequency-temperature parameter extraction measurements, it can be shown the thermistor normalization resistance uncertainty and the temperature measurement bias can be combined into a single temperature bias term, which becomes embedded in the $T_{Offset}$ term upon crystal resonator-based reference oscillator cubic model (analytic) parameter extraction.

With these preliminary aspects of the crystal resonator-based reference oscillator modeling technique established, in one embodiment, further improvement (relative to the conventional cubic polynomial model) is achieved by establishing the cubic ($T_{Offset}$ formulation) polynomial model's temperature dependent parameter relationships. In one embodiment, an approximate central derivative which is truly a (numerical) central difference as given by $$\frac{df_{Ref}}{dT} \approx \frac{f_{Ref}(T+\Delta T) - f_{Ref}(T-\Delta T)}{2\Delta T} \quad \text{(Equation 21)}$$

and is applied to the entire crystal resonator-based reference oscillator representative sample population characterization data. The resulting data is hereafter designated the crystal resonator-based reference oscillator representative sample population differential data or differential data. The approximate central derivative (of Equation 21) is hereafter designated the numerical central derivative. In addition, the (exact) derivative of the cubic ($T_{Offset}$ formulation) polynomial model of Equation 20 is given by $$\frac{df_{Ref}}{dT} = p'_1 + 3p'_3(T-T_0)^2. \quad \text{(Equation 22)}$$

Hereafter, this (exact) derivative of the cubic ($T_{Offset}$ formulation) polynomial model is designated the ($T_{Offset}$ formulation) parabolic model. The sample data for each sample of the sample population now consists of a characterization data set and a differential data set.

One technique for encoding a given parameter's temperature-dependence, herein designated the polynomial method, is accomplished by encoding the temperature-dependent parameter of interest as follows $$p'_i = p'_{i(0)}(1+p'_{i(1)})(T-T_0) + p'_{i(2)}(T-T_0)^2 + \ldots + p'_{i(n)}(T-T_0)^n) \quad \text{(Equation 23)}$$

where $p'_{i(0)}, p'_{i(1)}, p'_{i(2)} \ldots p'_{i(n)}$ are designated the $p'_i$ parameter's temperature-dependent sub-parameters. Techniques for determining a given cubic polynomial parameter's temperature-dependence include, but should not be limited to, methods such as linear regression, polynomial regression, Principal Components, etc. Furthermore, either of the crystal resonator-based reference oscillator's sample population frequency versus temperature data (designated the crystal sample frequency domain data), the numerical central derivative of the crystal sample frequency domain data (designated the crystal sample differential frequency domain data), or the numerical central derivative of the crystal sample differential frequency domain data (designated the crystal sample double differential frequency domain data) may be used in determining a cubic polynomial parameter's temperature dependence—provided that parameter is present in the corresponding model (i.e. the cubic polynomial model of Equation 20 for the frequency domain, the parabola model of Equation 22 for the differential frequency domain, or in the case of the double differential frequency domain, the linear model, which is obtained by taking the partial derivative of Equation 22 with respect to temperature).

In one embodiment, the crystal resonator-based reference oscillator's final temperature-dependent cubic ($T_{Offset}$ formulation) model takes the form $$f_{Ref}(T) = p'_{0(0)} + p'_{1(0)}(1+p'_{1(1)}(T-T_0))(T-T_0) + ((\alpha_{(1,3)}p'_{1(0)} + p'_{3(0)})(1+p'_{3(1)}(T-T_0)))(T-T_0)^3 \quad \text{(Equation 24)}.$$

For this exemplary temperature-dependent cubic model, the parameter $\alpha_{(1,3)}p'_{1(0)}$ represents the correlation between parameters $p'_1$ & $p'_3$. Furthermore, the parameters $p'_{1(1)}$, $p'_{3(1)}$, & $\alpha_{(1,3)}$ in Equation 24 are determined using a representative sample population data (including the numerical central derivatives thereof) and, for production purposes, are fixed thereafter leaving the parameters $p'_{0(0)}$, $p'_{1(0)}$, $T_0$, & $p'_{3(0)}$ to be analytically extracted from a few (~four or less) factory frequency and temperature measurement pairs. In at least one embodiment, the few factory frequency and temperature measurement pairs are interleaved with previously existing factory measurements, such as the cellular system's RF tuning and calibration.

In another embodiment, the full operational temperature range is segregated into a plurality of partial-temperature ranges. Furthermore, each of the partial-temperature ranges is comprised of a sub-range of temperatures, which overlap the adjacent partial-temperature ranges. Using the collective sample crystal frequency domain data, sample crystal differential frequency domain data, and sample crystal double frequency domain data that was previously defined, fixed parameter cubic ($T_{Offset}$ formulation) models are determined for each of the partial-temperature ranges. Each of these partial-temperature range fixed parameter cubic ($T_{Offset}$ formulation) models is pieced together into a multi-range model using transition functions.

In one embodiment, the transition functions are comprised of hyperbolic tangent functions such as the Low-pass, Band-pass, and High-pass functions defined in Equation 25:

$$\text{Lowpass}[T_{LP}] = \frac{1}{2}\left(1 + \text{Tanh}\left[\frac{2(T_{LP}-T)}{\Delta T_{Rise}}\right]\right) \quad \text{(Equation 25)}$$

$$\text{Highpass}[T_{HP}] = \frac{1}{2}\left(1 + \text{Tanh}\left[\frac{2(T-T_{HP})}{\Delta T_{Rise}}\right]\right)$$

$$\text{Bandpass}[T_{LP}, T_{HP}] = \text{Lowpass}[T_{HP}] \times \text{Highpass}[T_{LP}].$$

Note that in the Band-pass function, the roles of $T_{LP}$ & $T_{HP}$ are reversed relative to when used with the Low-pass or High-pass functions. In addition, the parameter $\Delta T_{Rise}$ is generally common to all transition functions as in this embodiment and scales each transition function's rise/fall temperature spans (i.e. 10% to 90% in ° C.). Other transition function techniques include but are not limited to linear transitions and look-up tables. The best performing transition function embodiments are those in which the transition function, as well as its first and second derivatives (with respect to temperature), are continuous functions.

In one embodiment, the full operational temperature range is comprised of three partial-temperature ranges. For this embodiment, one of the possible models of the method is given by $$f_{Ref}(T) = (p'_1(1+\delta p_{1_{Cold}})(T-T_0) + p'_3(1+\delta p_{3_{Cold}})(T-T_0)^3) \text{Lowpass}[T_{LP}] + p'_0 + (p'_1(T-T_0) + p'_3(T-T_0)^3) \text{Bandpass}[T_{LP}, T_{HP}] + (p'_1(1+\delta p_{1_{Hot}})(T-T_0) + p'_3(1+\delta p_{3_{Hot}})(T-T_0)^3) \text{Highpass}[T_{HP}]$$ (Equation 26).

By inspection, Equation 26 simplifies to $$f_{Ref}(T) = p'_0 + p'_1(T-T_0) + p'_3(T-T_0)^3 + (\delta p_{1_{Cold}}(T-T_0) + \delta p_{3_{Cold}}(T-T_0)^3) \text{Lowpass}[T_{LP}] + (\delta p_{3_{Hot}}(T-T_0) + \delta p_{3_{Hot}}(T-T_0)^3) \text{Highpass}[T_{HP}]$$ (Equation 27).

For this exemplary multi-temperature region cubic model (either Equation 26 and 27), the parameters in Equations 25 through 27 are determined using a representative sample population preferably prior to production deployment. For production purposes, these parameters ($\delta p_{1_{Cold}}$, $\delta p_{3_{Cold}}$, $\delta p_{1_{Hot}}$, $\delta p_{3_{Hot}}$, $T_{LP}$, $T_{HP}$ & $\Delta T_{Rise}$) are fixed thereafter, leaving the parameters $p'_0$, $p'_1$, $T_0$ & $p'_3$ to be analytically extracted from a few (four or less) factory frequency and temperature measurement pairs that are usually interleaved with previously existing factory measurements, such as the cellular system's RF tuning and calibration.

The frequency error slew for an exemplary three segments curve fitting in cold/room/hot, where polynomial coefficients in cold and hot are computed from room temperature coefficients, is plotted in a dashed line in FIG. 11. As shown in FIG. 11, the frequency error slew with the improved curve fitting design has +/−5 ppb/sec across an entire temperature range from −30° C. to 85° C.

In addition to the temperature sensing circuit and associated temperature-to-frequency compensation algorithms, a learning algorithm can be applied to any of the models in this disclosure to further improve the model's veracity over time. The learning algorithm collects temperature and frequency measurements through normal GPS operation and fine tunes polynomial parameters over large data samples to further reduce curve fitting error In some embodiments, multiple temperature-frequency pairs can be measured in factory to extract curve fitting coefficients. In at least one embodiment, the few factory frequency and temperature measurement pairs are interleaved with previously existing factory measurement such as cellular system's RF tuning and calibration.

Figure 13:
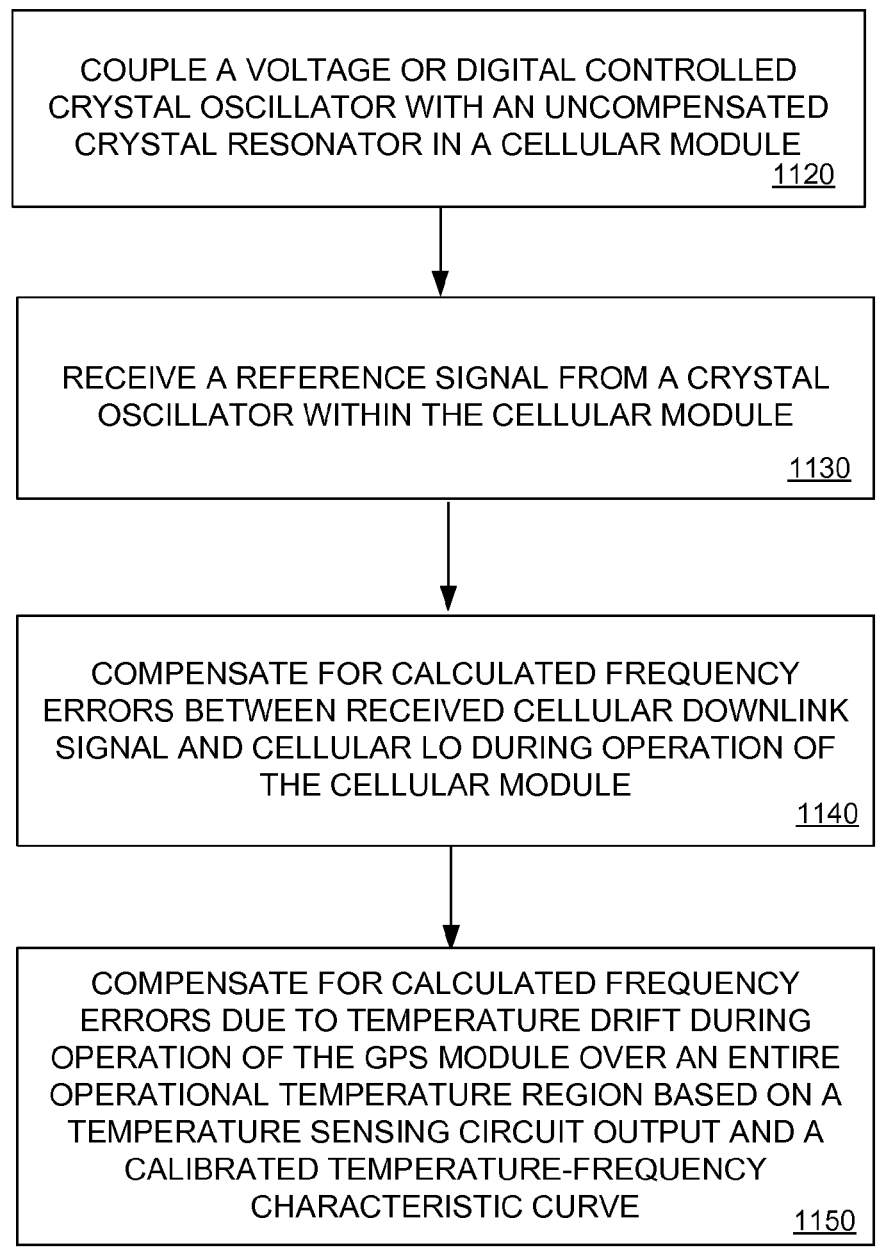

In other embodiments, to minimize factory test time associated with calibrating the crystal resonator's frequency deviation versus temperature characteristic, a single factory floor XO frequency offset measurement is performed and recorded in system memory 1062 (FIG. 13). This single frequency-temperature measurement pair is subsequently used in conjunction with a self learning algorithm that allows the GPS temperature compensation algorithm to adapt to the shared crystal resonator's particular frequency versus temperature characteristics, which deviates from the population mean as a result of crystal resonator-based oscillator unit-to-unit variation.

One embodiment of a system in accordance with the present disclosure features a crystal resonator 102 that is uncompensated and configured to provide a high-Q resonating capacitance frequency source to a crystal oscillator 103; a temperature sensor 105 whose electrical resistance varies as a function of temperature in a manner that is both substantially repeatable and predictable; and the crystal oscillator 103 configured to output a reference clock frequency for a cellular system 101 and a global positioning system 108. The system further includes a programmable cellular RF phase locked loop 112 configured to receive the reference clock within a cellular RF module 104 and compensate for calculated frequency errors between cellular received downlink signal and cellular LO during operation of the cellular communication module 101; a programmable cellular baseband digital phase 110 locked loop configured to generate a compensated clock based on the aforementioned cellular calculated frequency error for baseband module 106; and a programmable GPS RF phase locked loop 114 and a programmable GPS baseband numerically controlled oscillator 115 configured to receive the reference clock frequency and also capable of receiving reference clock frequency error estimate signals (including error from temperature drift) and compensating (i.e. offsetting) their respective programmed output signals in a manner that substantially cancels the effect of the estimated frequency error from their respective output signals. Additionally, a temperature sensing circuit 122 is configured to output a voltage substantially proportional to the crystal temperature as indicated by the aforementioned temperature sensor 105. The temperature sensing circuit 122 comprises a resistive divider circuit, an operational amplifier (A), feedback and voltage offset resistors, and an analog-to-digital converter (ADC). The resistive divider circuit is further comprised of a temperature sensor (thermistor) resistive element and a plurality of switched sense/bias resistors.

An analytic temperature sensor (thermistor) model is configured to receive the temperature sensing circuit's output voltage signal and map this voltage signal to a temperature sensor resistance estimate and further translate the temperature sensor resistance estimate to a crystal resonator-based reference oscillator temperature estimate. An analytic crystal reference oscillator frequency deviation versus temperature model is configured to receive the analytic temperature sensor model's temperature estimate signal, which is then translated to a frequency deviation (i.e. error relative to an ideal fixed reference frequency) estimate through a one-to-one mapping between the crystal resonator temperature and reference oscillator frequency deviation that is based on a calibrated temperature-to-frequency characteristic curve. A GPS PLL 114 and/or GPS NCO 115 are configured to receive the frequency deviation estimate signal and are also capable of compensating (i.e. offsetting) the frequency and/or phase of their respective programmed output signals in a manner that substantially cancels the effect of the estimated frequency error from their respective output signals thereby allowing the GPS PLL 114 and/or GPS NCO 115 to output frequency signals that are substantially temperature compensated in order for the GPS system 108 to accurately process the received satellite signals.

In various embodiments, the system may further include multiple segments of a curve fitting to fit a crystal frequency deviation versus temperature with each segment corresponding to a subset in the entire operational temperature range. In various embodiments, the cold and hot temperature polynomial coefficients in the multi-segmented temperature-to-frequency-curve fitting are derived from the room temperature polynomial coefficients. In various embodiments, the multi-segmented curve fitting significantly reduces slew of residual frequency error from curve fitting after temperature compensation to meet GPS frequency slew requirement with sufficient margin.

In various embodiments, the system may further include temperature dependent polynomial coefficients of a curve fitting to fit a crystal frequency deviation versus temperature. The temperature dependent polynomial coefficients (instead of fixed over temperature range as in conventional model) are determined using a representative sample population data in conjunction with parameters extracted from a few factory temperature-frequency measurement pairs. In some embodiments, this can be combined with segmented temperature-to-frequency curve fitting. In various embodiments, a temperature compensation module 123 operates with or without a self learning algorithm which can further optimize the curve fitting.

In various embodiments, the crystal resonator-based oscillator circuitry (e.g., crystal resonator 102 & crystal oscillator 103) is allowed to run free for the cellular communication module 101, the GPS module 108, and temperature compensation module 123. In various embodiments, the temperature sensing circuit 122 is integrated in the GPS system 108; is external to the GPS system 108; is integrated in a cellular system 101, where the GPS is a separated processor; is external to a cellular system 101, where a GPS is a separated processor; is integrated in a cellular-GPS combo system; or is external to a cellular-GPS combo system.

In various embodiments, the temperature sensing circuit 122 comprises multiple sense resistors, with each designed to cover a sub-set of a full operating temperature region from −30° C. to 85° C. The multiple sense resistors in the temperature sensing circuit 122 can be in low voltage position in a voltage divider (i.e., close to ground) or can be in the high voltage position in a voltage divider (i.e., close to $V_{REF}$).

In various embodiments, the temperature sensing circuit 122 includes an ADC with an impedance buffer at its input; includes an ADC without an impedance buffer at its input; includes an impedance buffer with greater than unity gain amplifier (A); includes an impedance buffer with unity gain amplifier (A); includes a gain amplifier (A) that has constant gain versus temperature; includes a gain amplifier (A) that has variable gain versus temperature; includes an ADC with a voltage offset at its input; and/or includes an ADC without a voltage offset at its input. In various embodiments, the ADC in the temperature sensing circuit 122 operates with or without over sampling and dithering between two adjacent temperature sub-regions.

In various embodiments, a voltage offset in the temperature sensing circuit 122 can be a constant offset versus temperature or can be a variable offset versus temperature. In various embodiments, calibration for the temperature sensing circuit 122 is performed at a factory with or without an integrated control sequencer. In various embodiments, the temperature sensing circuit 122 significantly extends SNR and sensitivity to satisfy 1 milli-degree Centigrade resolution (~1 ppb frequency resolution) across the entire operation temperature range from −30° C. to 85° C. Further, a temperature-offset formulation of a polynomial function with or without its differential functions may be utilized to extract curve parameters to fit a crystal's temperature-to-frequency relationship, in various embodiments. Polynomial parameters with and without temperature dependency may also be utilized to fit a crystal's temperature-to-frequency relationship, in some embodiments. In other embodiments, multi-region models are combined using transition functions.

In various embodiments, a resistor array in the temperature sensing circuit 122 operates with or without a training resistance; operates with or without overlap region (separated from process variation); or operates with or without overlap hysteresis. In various embodiments, the resistor array in the temperature sensing circuit 122 operates with or without its resistance value tuned relative to the calibrated thermistor nominal resistance value to a target value.

Next, one embodiment of a system in accordance with the present disclosure features a crystal resonator 102 that is uncompensated and configured to provide a high-Q resonate frequency source to a crystal oscillator 103; a temperature sensor 105 whose electrical resistance varies as a function of temperature in a manner that is both substantially repeatable and predictable; the crystal oscillator 103 configured to output a reference clock frequency for a cellular system 101 and a global positioning system 108; a programmable cellular RF phase locked loop 112 configured to receive the reference clock within a cellular RF module 104 and compensate for calculated frequency errors between cellular received downlink signal and cellular LO during operation of the cellular RF module 104; a programmable cellular baseband digital phase locked loop 110 configured to generate a compensated clock based on the aforementioned cellular calculated frequency error for baseband modules 10; a temperature compensation module 123, a temperature sensing circuit 122 configured to output a voltage substantially proportional to the crystal temperature as indicated by the aforementioned temperature sensor 105; an analytic temperature sensor (thermistor) model that receives the temperature sensing circuit's output voltage (or current/resistance) signal and maps this voltage (or current) signal to a temperature sensor resistance estimate and further translates the temperature sensor resistance estimate to a crystal resonator-based reference oscillator temperature estimate; an analytic crystal resonator-based reference oscillator frequency deviation versus temperature model configured to receive the analytic temperature sensor model's temperature estimate signal, which is then translated to a frequency deviation (i.e. error relative to an ideal fixed reference frequency) estimate through a one-to-one mapping between the crystal resonator temperature and reference oscillator frequency deviation that is based on a calibrated temperature-to-frequency characteristic curve; a DCXO (or a voltage-controlled oscillator (VCO)) configured to receive the reference clock frequency and also capable of receiving reference clock frequency error estimate signals (error from temperature drift) and compensating (i.e. offsetting) their respective programmed output signals in a manner that substantially cancels the effect of the estimated frequency error from their respective output signals; and a clock buffer to buffer the temperature compensated reference clock from DCXO to GPS as a reference frequency signal, thereby allowing the GPS system 108 to accurately process the received satellite signals.

In various embodiments, the temperature sensing circuit 122 comprises a resistive divider circuit, an operational amplifier (A), feedback resistors, a voltage offset resistor, and an analog-to-digital converter (ADC). The resistive divider circuit is further comprised of a temperature sensor (thermistor) resistive element and a plurality of switched sense resistors.

Next, one embodiment of a system in accordance with the present disclosure a crystal resonator 102 that is uncompensated and configured to provide a high-Q resonate frequency source to a crystal oscillator 103; a temperature sensor 105 whose electrical resistance varies as a function of temperature in a manner that is both substantially repeatable and predictable; the crystal oscillator 103 configured to output a reference clock frequency for a global positioning standalone system 108; a programmable GPS RF phase locked loop 114 and a programmable GPS baseband numerically controlled oscillator 115 configured to receive the reference clock frequency and also capable of receiving reference clock frequency error estimate signals (including error from temperature drift) and compensating (i.e. offsetting) their respective programmed output signals in a manner that substantially cancels the effect of the estimated frequency error from their respective output signals; a temperature sensing circuit 122 configured to output a voltage (or current/resistance) substantially proportional to the crystal temperature as indicated by the aforementioned temperature sensor 105; an analytic temperature sensor (thermistor) model that receives the temperature sensing circuit's output voltage signal and maps this voltage signal to a temperature sensor resistance estimate and further translates the temperature sensor resistance estimate to a crystal resonator-based reference oscillator temperature estimate; and an analytic crystal resonator-based reference oscillator frequency deviation versus temperature model configured to receive the analytic temperature sensor model's temperature estimate signal, which is then translated to a frequency deviation (i.e. error relative to an ideal fixed reference frequency) estimate through a one-to-one mapping between the crystal resonator temperature and reference oscillator frequency deviation that is based on a calibrated temperature-to-frequency characteristic curve.

In various embodiments, the temperature sensing circuit 122 comprises a resistive divider circuit, an operational amplifier (A), feedback resistors, voltage offset resistor, and an analog-to-digital converter (ADC). The resistive divider circuit is further comprised of a temperature sensor (thermistor) resistive element and a plurality of switched sense resistors. In various embodiments, the frequency error due to temperature drift can also be compensated via a DCXO or a VCO.

Next, one embodiment of a method in accordance with the present disclosure features coupling a crystal oscillator 103 with a crystal resonator 102 (that is uncompensated) in a cellular module 101; receiving a reference signal from the crystal oscillator 103 within the cellular module 101; compensating, by a cellular RF phase locked loop 112 and a cellular baseband PLL 110, for calculated frequency errors between received cellular downlink signal and cellular LO during operation of the cellular module 101; receiving the reference signal from the crystal oscillator 103 within a global positioning system (GPS) module 108; and compensating, by a GPS RF PLL 114 or by a GPS BB NCO 115, for calculated frequency errors due to temperature drift during operation of the GPS module 108 over an entire operational temperature region based on temperature sensing circuit output and a calibrated temperature-frequency characteristic curve.

In various embodiments, the method further includes converting a temperature from a thermistor into a voltage through a voltage divider, where a resistor array with switches to control each resistor in open or closed position in a way such that the voltage divider is connected to the resister(s) that is (are) in the closed position(s). In some embodiments, in place of the voltage divider, a resistive divider or a current divider may be used.

Resistance value for the resistors in the array is optimized for its corresponding sub-temperature region across −30° C. to 85° C. Minimum overlap of temperature at each switching point is allocated to ensure no temperature gap between two adjacent temperature regions under worst case processing variation and uncertainty after factory calibration.

In various embodiments, the method further includes converting sense voltage to digital readings through ADC with or without a gain amplifier, and with or without a voltage offset before the ADC. The gain can be constant or variable through entire temperature range. The voltage offset can be constant or variable through entire temperature range. In various embodiments, the method further includes tuning ratio of sense/bias resistance value $R_S$ and thermistor normal resistance value $R_N$, (i.e. $R_S/R_N$) to a specific target in factory; and tuning sense/bias resistance and measurement for all resistors in the resistor array with a sequencer to reduce calibration time.

In various embodiments, the method further includes characterizing a relationship between temperature-to-frequency curve fitting coefficients at a cold temperature and coefficients at a room temperature; characterizing a relationship between temperature-to-frequency curve fitting coefficients at a hot temperature and a room temperature based on a small set of representative crystal samples; extracting temperature-to-frequency curve fitting coefficients for the room temperature based on a set of frequency-temperature measurements during factory calibration; computing temperature-to-frequency fitting coefficients for the cold and hot temperatures based on the room temperature coefficients and the characterization obtained through study over the small set of crystal samples; and fitting a crystal frequency deviation of the crystal resonator 102 over temperature to a model with multiple polynomial segments with each segment corresponding a sub-temperature region from −30° C. to 85° C.

Figure 12:
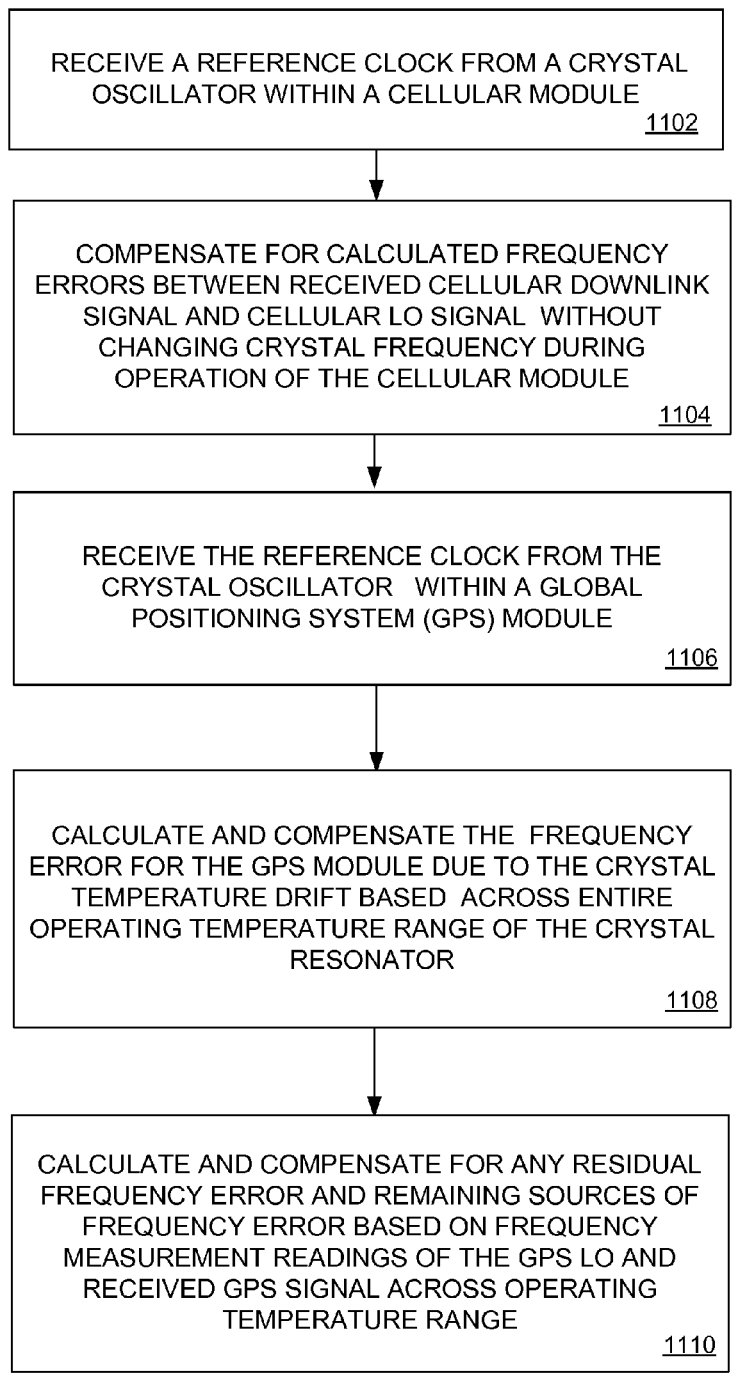
FIGS. 12-14 are flow charts of various embodiments of methods for sharing a crystal resonator in accordance with the present disclosure.

Having described certain embodiments and components of the co-integrated reference crystal oscillator systems, one method of sharing a reference crystal resonator 102, illustrated in the flow chart of FIG. 12, comprises receiving (1102) a reference clock from a crystal oscillator 103 within a cellular module 101 and compensating (1104) for calculated frequency errors between received cellular downlink signal and cellular LO signal in cellular RF and BB without changing crystal frequency during operation of the cellular module 101. Further, the reference clock from the crystal oscillator 103 is also received (1106) within a global positioning system (GPS) module 108. For the GPS module 108, frequency error due to the crystal temperature drift is calculated (via GPS or cellular software/firmware) and compensated (1108) (via GPS or cellular software/firmware) based on temperature sensing circuit 122, multi-segmented crystal temperature-to-frequency characteristic curve, and associated temperature compensation algorithm(s) across entire operating temperature range of the crystal resonator 102. This compensation can be performed in GPS Rx PLL 114, GPS BB NCO 115, or in both, and the crystal resonator 102 is left free running completely, in this embodiment. It is also possible to compensate frequency error due to temperature drift in the crystal via a DCXO or a VCO, where the crystal oscillator's frequency is corrected only by the temperature compensation algorithm, but not from cellular AFC. Any residual frequency error and remaining sources of frequency error are calculated and compensated (1110) based on frequency measurement readings of the GPS LO (based on reference clock from crystal oscillator 103) and received GPS signal across an entire operating temperature range.

Next, in the flow chart of FIG. 13, one embodiment of sharing a reference crystal resonator 102 comprises coupling (1120) a voltage or digital controlled crystal oscillator with the crystal resonator 102 that is uncompensated; receiving (1130) a reference signal from a crystal oscillator 103 within a cellular module 101; compensating (1140), by a cellular RF phase locked loop 112 and a cellular baseband PLL 110, for calculated frequency errors between received cellular downlink signal and cellular LO during operation of the cellular module 101; and compensating (1150), by the voltage controlled or digitally controlled crystal oscillator, for calculated frequency errors due to temperature drift during operation of the GPS module 108 over an entire operational temperature region based on temperature sensing circuit output and a calibrated temperature-frequency characteristic curve.

In various embodiments, the method further includes coupling a crystal oscillator 103 with the uncompensated crystal resonator 102 in a GPS module 108; receiving the reference signal from the crystal oscillator 103 within the GPS module 108; and compensating, by a GPS RF PLL 114 or by a GPS BB NCO 115, for calculated frequency errors due to temperature drift during operation of the GPS module 108 over an entire operational temperature region based on temperature sensing circuit output and a calibrated temperature-frequency characteristic curve.

Figure 14:
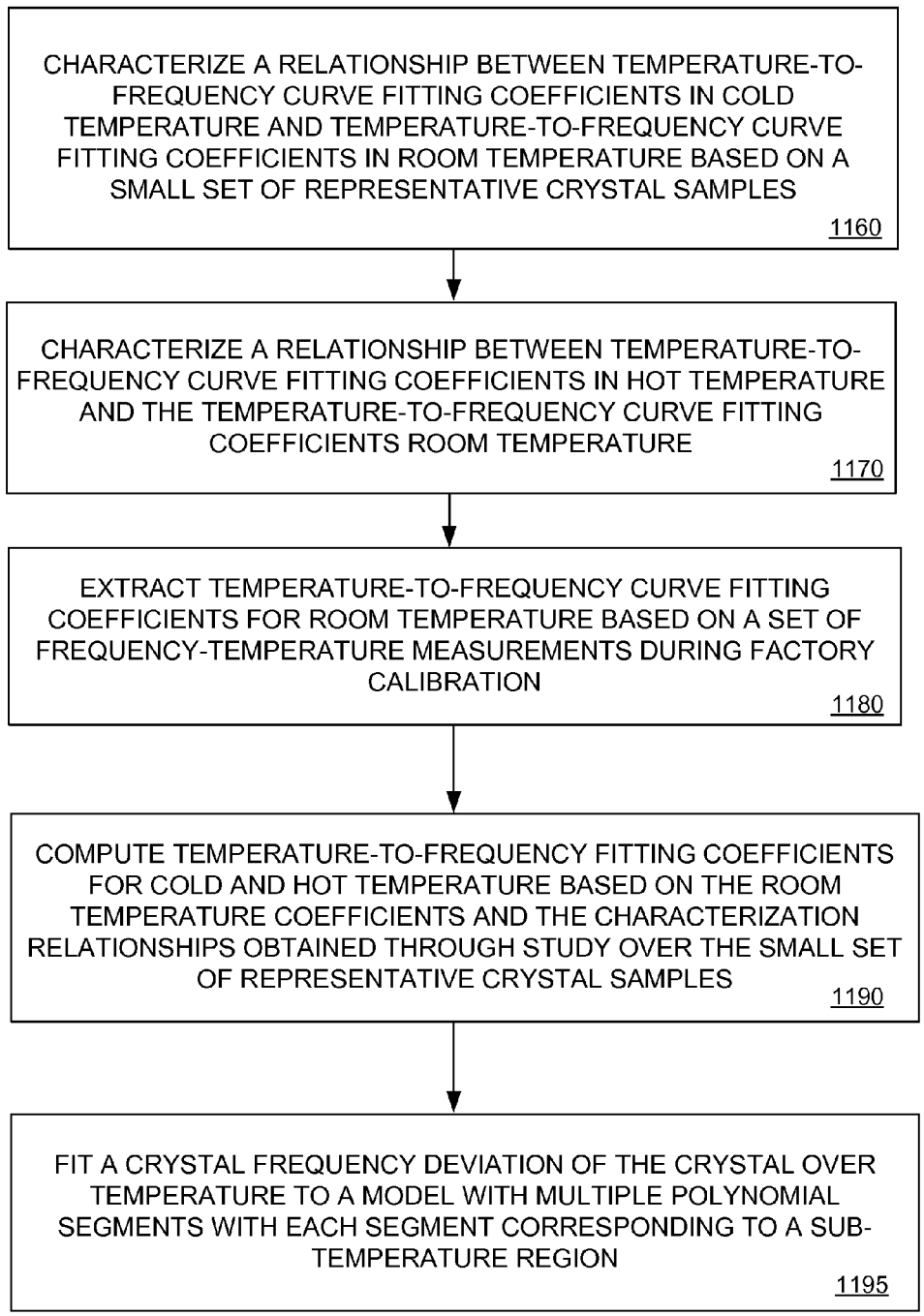

Referring now to FIG. 14, one embodiment of a method for sharing a crystal resonator 102 comprises characterizing (1160) a relationship between temperature-to-frequency curve fitting coefficients in cold temperature and temperature-to-frequency curve fitting coefficients in room temperature based on a small set of representative crystal samples; characterizing (1170) a relationship between temperature-to-frequency curve fitting coefficients in hot temperature and the temperature-to-frequency curve fitting coefficients room temperature; extracting (1180) temperature-to-frequency curve fitting coefficients for room temperature based on a set of frequency-temperature measurements during factory calibration; computing (1190) temperature-to-frequency fitting coefficients for cold and hot temperature based on the room temperature coefficients and the characterization relationships obtained through study over the small set of representative crystal samples; and fitting (1195) a crystal frequency deviation of the crystal over temperature to a model with multiple polynomial segments with each segment corresponding to a sub-temperature region (e.g., from −30° C. to 85° C.).

Figure 15:
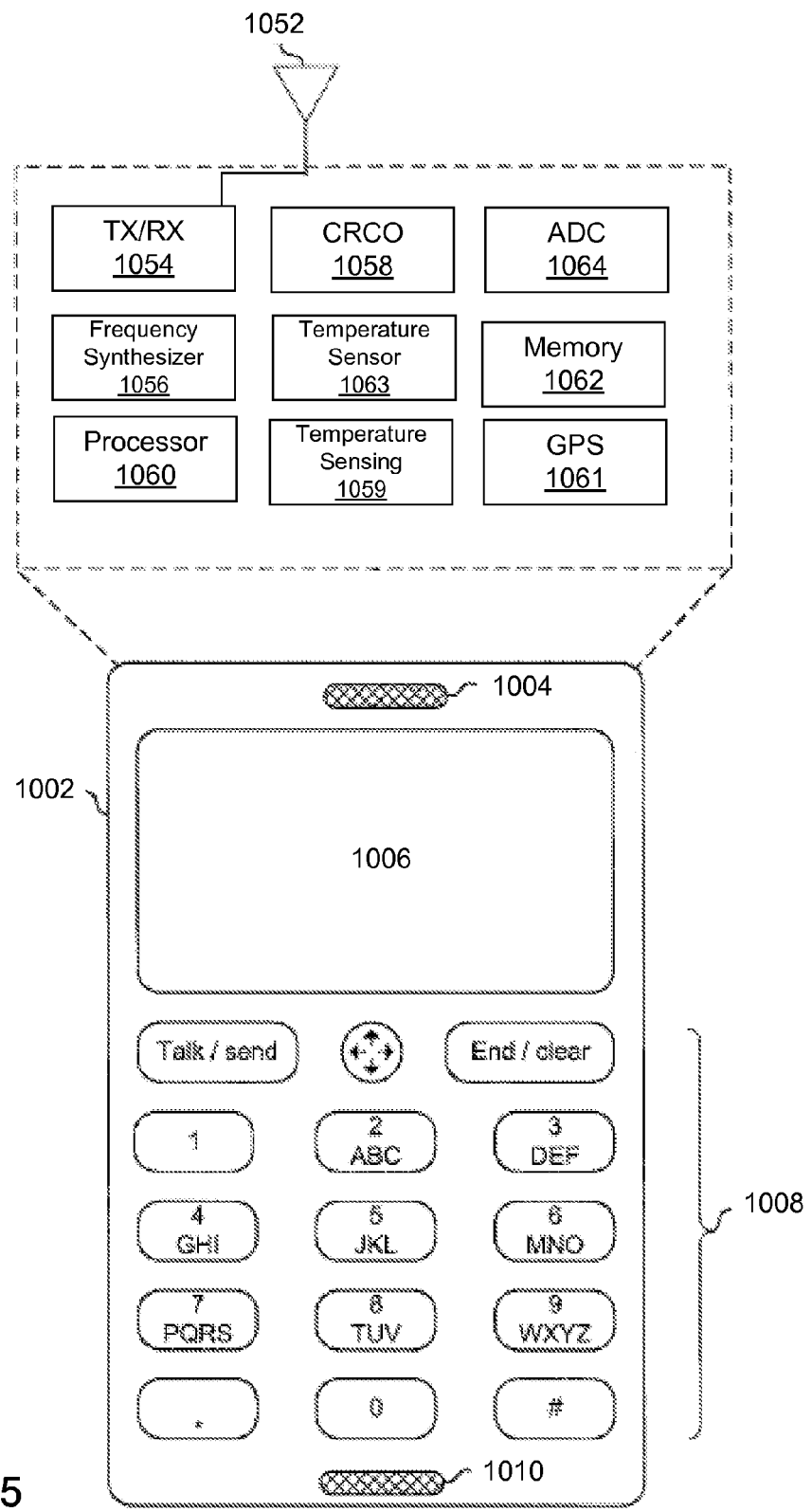
FIG. 15 is a diagram illustrating an exemplary communication device comprising a co-integrated reference crystal oscillator system in accordance with an embodiment of the present disclosure.

Referring next to FIG. 15, the figure illustrates an exemplary communication device comprising a co-integrated reference crystal oscillator system (CRCO) 1058 and temperature sensing circuit 1059, in accordance with an embodiment of the present disclosure. Although a communication device is used for illustration, a CRCO 1058 may be utilized in any type of electronic device or package. The communication device 1002 may comprise an antenna 1052, a cellular transmitter and/or receiver module (Tx/Rx) 1054 (e.g., cellular system 101), a processor 1060, a GPS system 1061 (e.g., GPS system 108), a memory 1062, an analog-to-digital converter (ADC) 1064, a CRCO 1058 (e.g., crystal resonator 102 & crystal oscillator 103), a temperature sensing circuit 1059 (e.g., temperature sensing circuit 122), a temperature sensor 1063 (e.g., temperature sensor 105), a display 1006, user controls 1008, a speaker 1004, and a microphone 1010.

The antenna 1052 may be suitable for transmitting and/or receiving wireless signals. Although a single antenna is illustrated, embodiments are not so limited. In this regard, the Tx/Rx 1054 may utilize a common antenna for transmission and reception, may utilize different antennas for transmission and reception, and/or may utilize a plurality of antennas for transmission and/or reception.

The co-integrated reference crystal oscillator system (CRCO) 1058 may comprise a crystal and suitable logic, circuitry, and/or code that may be operable to generate one or more oscillating signals. Additionally, the CRCO 1058 may provide one or more signals and data that may enable determination of a frequency of the generated oscillating signals over time and/or temperature variations.

In some embodiments, the CRCO 1058 may be coupled to one or more external components to realize a crystal oscillator circuit. In other embodiments, the CRCO 1058 may comprise one or more active and/or passive components coupled to a crystal resonator 102 to realize a crystal oscillator circuit. In such embodiments, the CRCO 1058 may generate an oscillating signal without external components besides the crystal resonator 102. A temperature sensor 1063 (e.g., thermistor) is integrated with the CRCO 1058, in one embodiment, to provide temperature readings that can be used to calculate frequency measurements. In alternative embodiments, an external temperature sensor 1063 may be employed.

The frequency synthesizer 1056 may comprise suitable logic, circuitry, and/or code that may be operable to generate one or more oscillating signals. In some embodiments, the frequency synthesizer 1056 may comprise active and/or passive components which may be coupled to xtal+ and xtal− terminals of the CRCO 1058 to realize a crystal oscillator circuit. In some embodiments, the frequency synthesizer may comprise, for example, an integer-N PLL, fractional-N PLL, and/or a direct digital frequency synthesizer (DDFS). An output of the crystal oscillator circuit may be coupled to and provide a reference frequency to the PLL and/or DDFS.

In the exemplary embodiment depicted in FIG. 15, the frequency synthesizer 1056 is shown as a separate block; however, embodiments are not so limited. In various embodiments, a portion, or all, of the frequency synthesizer 1056 may be integrated into the Tx/Rx 1054.

The Tx/Rx 1054 may comprise suitable logic, circuitry, interfaces, and/or code that may be operable to transmit and/or receive signals utilizing a variety of wireless protocols. Exemplary communication wireless protocols utilized by the communication device 1002 may comprise various cellular protocols, WiMAX, Bluetooth, Wi-Fi, DVB-H/S/T (digital video broadcasting-handheld/satellite/terrestrial), GNSS (global navigation satellite system), broadcast radio, and broadcast television. The Tx/Rx 1054 may be operable to perform amplification, down-conversion, filtering, demodulation, and analog to digital conversion of received signals. The Tx/Rx 1054 may be operable to perform amplification, up-conversion, filtering, modulation, and digital to analog conversion of signals to be transmitted. In various embodiments, the Tx/Rx 1054 may utilize one or more reference frequencies from the frequency synthesizer 1056 and/or the CRCO 1058.

The processor 1060 may comprise suitable logic, circuitry, interfaces, and/or code that may enable processing data and/or controlling operations of the communication device 1002. The processor 1060 may be enabled to provide and receive control signals to and from the various other portions of the communication device 1002. The processor 1060 may control transfers of data between various portions of the communication device 1002. In this regard, the processor 1060 may control reads and writes to memories and/or control registers in the communication device 1002. Additionally, the processor 1060 may enable execution of applications programs and/or code. The applications, programs, and/or code may enable, for example, processing of data, configuring portions of the communication device 1002, and/or controlling operation of the communication device 1002. For example, the processor 1060 may comprise a plurality of registers and an arithmetic and logic unit (ALU) for performing mathematic and logical manipulations of data and/or control signals.

The memory 1062 may comprise suitable logic, circuitry, and/or code that may be operable to store information comprising parameters and/or code that may effectuate the operation of the communication device 1002. Stored information may comprise received data and/or data to be presented, transmitted, and/or otherwise processed. For example, one or more received portions of one or more data streams may be buffered in the memory 1062. The parameters may comprise configuration data and the code may comprise operational code such as software and/or firmware, but the information need not be limited in this regard. In various embodiments, the memory 1062 may store data characterizing behavior of the CRCO 1058, and/or temperature sensing circuit 1059.

The ADC 1064 may comprise suitable logic, circuitry, interfaces and/or code that may be operable to convert analog signals to a digital representation. In this regard, the ADC 1064 may, for example, sample and quantize an analog signal at times specified by a sample clock. In various embodiments, the ADC 1064 may generate digital signals of one or more serial or parallel bits.

The temperature sensing circuit 1059 may be utilized with the temperature sensor 1063 to compensate a PLL of GPS system hardware and/or receiver channel digital clocks to maintain satellite lock over the free-running crystal's full temperature variation range of the CRCO 1058 in accordance with the present disclosure. The temperature sensing circuit 1059 may include hardware and suitable logic, circuitry, and/or code (e.g., GPS software 118, 120) that may be operable to detect, correct, and/or compensate for frequency errors in clock signals used by the GPS system.

The display 1006 may comprise suitable logic, circuitry, interfaces and/or code that may be operable to provide visual information to, and/or enable interaction by, a user of the communication device 1002. In various embodiments, a graphical user interface may be presented via the display 1006. The user interface of the mobile communication device 1002 may be utilized to select which source or sources it may have a desire to receive content from. A frequency and/or wireless standard to be utilized for communication may be selected based on user input. Accordingly, based on such user input, the frequency synthesizer 1056 and/or the Tx/Rx 1054 may be adjusted and/or configured. In various embodiments, a visual media content such as video, images, and text may be presented via the display 1006.

The user controls 1008 may be operable to enable user interaction with the communication device 1002 to control services and/or content handled by the communication device 1002. The user controls 1008 may comprise, for example, a keypad, a keyboard, a roller ball, a multidirectional button, a scroll wheels, and/or a touch screen.

The speaker 1004 may be operable to present audio information to a user. The speaker may present voice from a phone call and/or music or ringtones played back by the communication device. The microphone 1010 may be operable to convert acoustic signals into electronic signals. The microphone may enable a user to participate in a phone call and/or interact with the communication device via oral input.

In operation, various functions and/or portions of the communication device 1002 may utilize a reference frequency generated by the CRCO 1058 and the frequency synthesizer 1056. However, the reference frequency may change with, for example, time and/or temperature. There may also be hysteresis associated with temperature indications and/or frequency changes in the CRCO 1058. Accordingly, during production of the CRCO 1058, data characterizing the behavior of the CRCO 1058 may be stored in the CRCO 1058 or memory 1062. In some embodiments, the data may come from characterization and/or measurement of the CRCO 1058 itself. In other embodiments, the data may come from characterization of one or more other CRCOs, such as a CRCO from a same production run or lot, which may be representative of behavior of the CRCO 1058.

The characterization data may be utilized to configure and/or control portions of the communication system 1002 to compensate for variations in the behavior of the CRCO 1058 over time and/or temperature. In various embodiments, during operation of the communication device 1002, the processor 1060 may copy characterization data from the CRCO 1058 to the memory 1062. Subsequently, the processor 1060 may generate one or more control signals to configure a transmitter/receiver working with the GPS system or module 1061 based on the copied data and the received temperature indication. For example, the processor 1060 may configure a frequency divider of a PLL in the GPS system 1061. In other embodiments, the processor 1060 may not copy the data to memory 1062 but may read the data from the CRCO 1058 as needed. In addition, processor 1060 may also receive a temperature indication, which may be an analog voltage or digital voltage from sensing circuit 1059 to estimate frequency error associated with temperature drift and generate one or more control signals to configure GPS RF PLL or BB NCO or both to compensate the frequency error.

Certain embodiments of the present disclosure can be implemented in hardware, software, firmware, or a combination thereof. Embodiments may be implemented in software or firmware that is stored in a memory and that is executed by a suitable instruction execution system. If implemented in hardware, embodiments can be implemented with any or a combination of the following technologies, which are all well known in the art: a discrete logic circuit(s) having logic gates for implementing logic functions upon data signals, an application specific integrated circuit (ASIC) having appropriate combinational logic gates, a programmable gate array(s) (PGA), a field programmable gate array (FPGA), etc.

Any process descriptions or blocks in flow charts should be understood as representing modules, segments, or portions of code which include one or more executable instructions for implementing specific logical functions or steps in the process, and alternate implementations are included within the scope of an embodiment of the present disclosure in which functions may be executed out of order from that shown or discussed, including substantially concurrently or in reverse order, depending on the functionality involved, as would be understood by those reasonably skilled in the art.

The temperature compensation software program, which comprises an ordered listing of executable instructions for implementing logical functions, can be embodied in any computer-readable medium for use by or in connection with an instruction execution system, apparatus, or device, such as a computer-based system, processor-containing system, or other system that can fetch the instructions from the instruction execution system, apparatus, or device and execute the instructions. In the context of this document, a "computer-readable medium" can be any means that can contain, store, communicate, or transport the program for use by or in connection with the instruction execution system, apparatus, or device. The computer readable medium can be, for example but not limited to, an electronic, magnetic, optical, electromagnetic, infrared, or semiconductor system, apparatus, or device. More specific examples (a nonexhaustive list) of the computer-readable medium would include the following: an electrical connection (electronic) having one or more wires, a portable computer diskette (magnetic), a random access memory (RAM) (electronic), a read-only memory (ROM) (electronic), an erasable programmable read-only memory (EPROM or Flash memory) (electronic), an optical fiber (optical), and a portable compact disc read-only memory (CDROM) (optical). In addition, the scope of the certain embodiments includes embodying certain functionality in logic embodied in hardware or software-configured mediums.

It should be emphasized that the above-described embodiments of the present disclosure are merely possible examples of implementations, merely set forth for a clear understanding of the principles of the disclosure. Many variations and modifications may be made to the above-described embodiment(s) without departing substantially from the spirit and principles of the present disclosure. All such modifications and variations are intended to be included herein within the scope of this disclosure and protected by the following claims.

Therefore, having thus described various embodiments, at least the following is claimed:

1. A system, comprising:
   an uncompensated crystal resonator configured to provide a frequency source to a crystal oscillator;
   a temperature sensor whose electrical resistance varies as a function of temperature in a manner that is both substantially repeatable and predictable and is configured to measure a current temperature;
   a crystal oscillator configured to output a reference clock frequency signal for a cellular module and a global positioning system (GPS) module;
   a programmable cellular radio frequency (RF) phase locked loop configured to receive a reference clock signal of the crystal oscillator within the cellular module and compensate for a calculated frequency error between a cellular received downlink signal and a cellular local oscillator (LO) signal during operation of the cellular module;
   a programmable cellular baseband digital phase locked loop configured to generate a compensated clock for baseband frequency signaling based on the calculated frequency error;
   a programmable GPS RF phase locked loop and a programmable GPS baseband numerically controlled oscillator configured to receive the reference clock frequency signal and capable of receiving reference clock frequency error estimate signals corresponding to an estimated frequency error and compensate output signals of the GPS RF phase locked loop and the programmable GPS baseband numerically controlled oscillator in a manner that substantially cancels an effect of the estimated frequency error from the output signals;
   a temperature sensing circuit configured to output a signal substantially proportional to the current temperature as indicated by the temperature sensor;
   an analytic temperature sensor model configured to receive an output signal of the temperature sensing circuit and map the output signal of the temperature sensing circuit to a temperature sensor resistance estimate and further translate the temperature sensor resistance estimate to a crystal resonator reference oscillator temperature estimate;
   an analytic crystal reference oscillator frequency deviation versus temperature model configured to receive the temperature sensor resistance estimate of the analytic temperature sensor model and translate the temperature sensor resistance estimate to a frequency deviation estimate through a one-to-one mapping between the crystal resonator temperature and reference oscillator frequency deviation that is based on a calibrated temperature-to-frequency characteristic curve,
   wherein the programmable GPS RF phase locked loop, the programmable GPS baseband numerically controlled oscillator, or a combination of both are further configured to receive the frequency deviation estimate and compensate a frequency of the output signals, a phase of the output signals, or a combination of both in a manner that substantially cancels an effect of the estimated frequency error from the output signals of the GPS RF phase locked loop and the programmable GPS baseband numerically controlled oscillator thereby allowing the GPS RF phase locked loop, GPS baseband numerically controlled oscillator, or the combination of both to output frequency signals that are substantially temperature compensated in order to accurately process received satellite GPS signals,
   wherein the temperature sensing circuit comprises resistor divider circuits, an operational amplifier, feedback resistors, voltage offset resistors, and an analog-to-digital converter (ADC),
   wherein the resistor divider circuit is further comprised of a temperature sensor resistive element and a plurality of switched sense resistors.

2. The system of claim 1, wherein the crystal oscillator runs free for the cellular module, the GPS module, and the temperature sensing circuit.

3. The system of claim 1, wherein the crystal oscillator comprises a digital controlled crystal oscillator (DCXO) configured to receive the reference clock signal and compensate for frequency errors in the reference clock signal during operation of the GPS module, wherein the frequency errors include an error from temperature drift.

4. The system of claim 1, where the temperature sensing circuit is realized through a single ended implementation.

5. The system of claim 1, where the temperature sensing circuit is realized through a differential implementation.

6. The system of claim 1, wherein the temperature sensor comprises a thermistor integrated with the uncompensated crystal resonator.

7. The system of claim 1, the temperature sensing circuit is integrated in the GPS module.

8. The system of claim 1, wherein the temperature sensing circuit is integrated on an integrated chip having a cellular-GPS combinational system.

9. The system of claim 1, the temperature sensing circuit is external to the GPS module or a cellular-GPS combinational system on an integrated chip.

10. The system of claim 1, wherein the temperature sensing circuit comprises multiple sense resistors, each sense resistor being designed to cover a sub-set temperature region from −30° C. to 85° C.

11. The system of claim 1, further comprising:
    multiple segments of a curve fitting to fit a crystal frequency deviation versus temperature with each segment corresponding to a subset in the entire operational temperature range.

12. The system of claim 1, further comprising:
    a frequency measurement module configured to fit a crystal frequency deviation with multiple sets of polynomial coefficients corresponding to subset of temperature measurements,
    wherein non-room temperature polynomial coefficients are derived from room temperature polynomial coefficients.

13. The system of claim 1, further comprising:
    a frequency measurement module configured to fit a crystal frequency deviation with multiple sets of polynomial coefficients corresponding to subset of temperature measurements,
    wherein the polynomial coefficients are temperature dependent.

14. A system, comprising:
an uncompensated crystal resonator configured to provide a frequency source to a crystal oscillator;
a temperature sensor whose electrical resistance varies as a function of temperature in a manner that is both substantially repeatable and predictable and is configured to measure a current temperature;
the crystal oscillator configured to output a reference clock frequency signal for a global positioning system (GPS);
a programmable GPS radio frequency (RF) phase locked loop and a programmable GPS baseband numerically controlled oscillator configured to receive the reference clock frequency signal and capable of receiving a reference clock frequency error estimate signal and compensate output signals of the GPS RF phase locked loop and the programmable GPS baseband numerically controlled oscillator in a manner that substantially cancels an effect of an estimated frequency error from the output signals;
a temperature sensing circuit configured to output a signal substantially proportional to the current temperature as indicated by the temperature sensor;
an analytic temperature sensor model configured to receive an output signal of the temperature sensing circuit and map the output signal of the temperature sensing circuit to a temperature sensor resistance estimate and further translate the temperature sensor resistance estimate to a crystal resonator reference oscillator temperature estimate;
an analytic crystal reference oscillator frequency deviation versus temperature model configured to receive the temperature sensor resistance estimate of the analytic temperature sensor model and translate the temperature sensor resistance estimate to a frequency deviation estimate through a one-to-one mapping between a temperature of the crystal resonator and a frequency deviation of the crystal oscillator that is based on a calibrated temperature-to-frequency characteristic curve;
wherein the programmable global positioning system (GPS) RF phase locked loop, the programmable GPS baseband numerically controlled oscillator, or a combination of both are further configured to receive the frequency deviation estimate and compensate a frequency of the output signals, a phase of the output signals, or a combination of both in a manner that substantially cancels an effect of the estimated frequency error from the output signals of the GPS RF phase locked loop and the programmable GPS baseband numerically controlled oscillator thereby allowing the GPS RF phase locked loop, GPS baseband numerically controlled oscillator, or a combination of both to output frequency signals that are substantially temperature compensated in order to accurately process received satellite GPS signals,
wherein the temperature sensing circuit comprises resistor divider circuits, an operational amplifier, feedback resistors, voltage offset resistors, and an analog-to-digital converter (ADC),
wherein the resistor divider circuit is further comprised of a temperature sensor resistive element and a plurality of switched sense resistors.

15. A method, comprising:
coupling a crystal oscillator with an uncompensated crystal resonator in a cellular module;
receiving a reference signal from the crystal oscillator within the cellular module;
compensating, by a cellular radio frequency (RF) phase locked loop and a cellular baseband PLL, for calculated frequency errors between a received cellular downlink signal and a cellular local oscillator signal during operation of the cellular module;
receiving the reference signal from the crystal oscillator within a global positioning system (GPS) module;
outputting, by a temperature sensing circuit, a signal substantially proportional to a current temperature; and
compensating, by a GPS RF phase locked loop, a GPS baseband numerically controlled oscillator, or a combination of both, for calculated frequency errors due to temperature drift during operation of the GPS module over entire operational temperature region based on temperature sensing circuit output and a calibrated temperature-frequency characteristic curve.

16. The method of claim 15, further comprising:
converting temperature from a thermistor into a voltage through a voltage divider, wherein the voltage divider includes a resistor array with switches to control each resistor in open or closed position such that the voltage divider is connected to any resistor that is in the closed position,
wherein a resistance value for resistors in the array is optimized for its corresponding sub-temperature region across −30° C. to 85° C.,
wherein a minimum overlap of temperature at each switching point is allocated to ensure there is no temperature gap between two adjacent temperature regions under a worst case processing variation and uncertainty after factory calibration.

17. The method of claim 16, further comprising:
converting sense voltage to digital readings through an analog to digital converter (ADC) of the temperature sensing circuit.

18. The method of claim 16, further comprising:
for the temperature sensing circuit, tuning a ratio of serial resistance value $R_S$ and thermistor normal resistance value $R_N$, to a specific target value; and
for the temperature sensing circuit, tuning serial resistance and measurement for all resisters in the resister array with a sequencer to reduce calibration time.

19. The method of claim 16, further comprising:
characterizing polynomials in temperature-to-frequency curve fitting as a function of temperature based on a small set of representative crystal samples;
fitting a frequency deviation of the crystal resonator over temperature from −30° C. to 85° C. to a model with above temperature dependent polynomial coefficients.

20. The method of claim 16, further comprising:
characterizing a relationship between temperature-to-frequency curve fitting coefficients for cold temperature and temperature-to-frequency curve fitting coefficients for room temperature based on a small set of representative crystal samples;
characterizing a relationship between temperature-to-frequency curve fitting coefficients for hot temperature and the temperature-to-frequency curve fitting coefficients for room temperature;
extracting the temperature-to-frequency curve fitting coefficients for room temperature based on a set of frequency-temperature measurements during factory calibration;
computing the temperature-to-frequency fitting coefficients for cold and hot temperature based on the room temperature coefficients and the characterization relationships obtained through analyzing the small set of representative crystal samples; and fitting a crystal frequency deviation of the crystal resonator over temperature to a model with multiple polynomial segments with each segment corresponding to a sub-temperature region from −30° C. to 85° C.

* * * * *